(12) United States Patent
Lee et al.

(10) Patent No.: US 11,393,833 B2
(45) Date of Patent: Jul. 19, 2022

(54) FERROELECTRIC RANDOM ACCESS MEMORY DEVICE WITH SEED LAYER

(71) Applicant: Taiwan Semiconductor Manufacturing Co., Ltd., Hsin-Chu (TW)

(72) Inventors: Bi-Shen Lee, Hsin-Chu (TW); Hsing-Lien Lin, Hsin-Chu (TW); Hsun-Chung Kuang, Hsinchu (TW); Yi Yang Wei, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/938,108

(22) Filed: Jul. 24, 2020

(65) Prior Publication Data

US 2021/0335799 A1 Oct. 28, 2021

Related U.S. Application Data

(60) Provisional application No. 63/013,628, filed on Apr. 22, 2020.

(51) Int. Cl.
*H01L 21/00* (2006.01)
*H01L 27/11507* (2017.01)
*H01L 49/02* (2006.01)

(52) U.S. Cl.
CPC ........ *H01L 27/11507* (2013.01); *H01L 28/56* (2013.01); *H01L 28/60* (2013.01)

(58) Field of Classification Search
CPC ..... H01L 27/11507; H01L 28/56; H01L 28/60
See application file for complete search history.

(56) References Cited

U.S. PATENT DOCUMENTS

| 10,276,697 | B1 | 4/2019 | Lu et al. |
| 2001/0007366 | A1 | 7/2001 | Kim et al. |
| 2004/0135182 | A1 | 7/2004 | An et al. |
| 2012/0194966 | A1 | 8/2012 | Zelner et al. |

(Continued)

FOREIGN PATENT DOCUMENTS

DE 10152636 A1 1/2003

OTHER PUBLICATIONS

Onaya et al. "Improvement in ferroelectricity of HfxZr1—xO2 thin films using top- and bottom-ZrO2 nucleation layers." APL Mater. 7, 061107 (2019), published on Jun. 27, 2019.

(Continued)

*Primary Examiner* — Richard A Booth
(74) *Attorney, Agent, or Firm* — Eschweiler & Potashnik, LLC

(57) ABSTRACT

In some embodiments, the present disclosure relates to an integrated chip. The integrated chip includes a bottom electrode disposed over a substrate and a top electrode disposed over the bottom electrode. A ferroelectric switching layer is arranged between the bottom electrode and the top electrode. The ferroelectric switching layer is configured to change polarization based upon one or more voltages applied to the bottom electrode or the top electrode. A seed layer is arranged between the bottom electrode and the top electrode. The seed layer and the ferroelectric switching layer have a non-monoclinic crystal phase.

20 Claims, 27 Drawing Sheets

(56) References Cited

U.S. PATENT DOCUMENTS

| | | | |
|---|---|---|---|
| 2015/0214322 A1* | 7/2015 | Mueller | H01L 21/0228 257/295 |
| 2017/0103988 A1* | 4/2017 | Nishida | H01L 29/517 |
| 2019/0074295 A1 | 3/2019 | Schroeder | |
| 2019/0148390 A1 | 5/2019 | Frank | |
| 2020/0035807 A1 | 1/2020 | Chen et al. | |
| 2020/0312950 A1 | 10/2020 | Haratipour et al. | |

OTHER PUBLICATIONS

Materlik et al. "The Origin of Ferroelectricity in HfxZr1—xO2: A Computational Investigation and a Surface Energy Model." Journal of Applied Physics 117, 134109 (2015), published on Apr. 7, 2015.
Dogan et al. "Causes of ferroelectricity in HfO2-based thin films: An ab initio perspective." Phys. Chem. Chem. Phys., 2019,21, 12150-12162, published on May 15, 2019.
Lufaso, Michael. "Chapter 2—Physical Methods for Characterizing Solids." University of North Florida, published on Feb. 13, 2019.

* cited by examiner

FERROELECTRIC RANDOM ACCESS MEMORY DEVICE WITH SEED LAYER

REFERENCE TO RELATED APPLICATION

This application claims the benefit of U.S. Provisional Application No. 63/013,628, filed on Apr. 22, 2020, the contents of which are hereby incorporated by reference in their entirety.

BACKGROUND

Many modern day electronic devices contain electronic memory configured to store data. Electronic memory may be volatile memory or non-volatile memory. Volatile memory stores data while it is powered, while non-volatile memory is able to store data when power is removed. Ferroelectric random-access memory (FeRAM) devices are one promising candidate for a next generation non-volatile memory technology. This is because FeRAM devices provide for many advantages, including a fast write time, high endurance, low power consumption, and low susceptibility to damage from radiation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
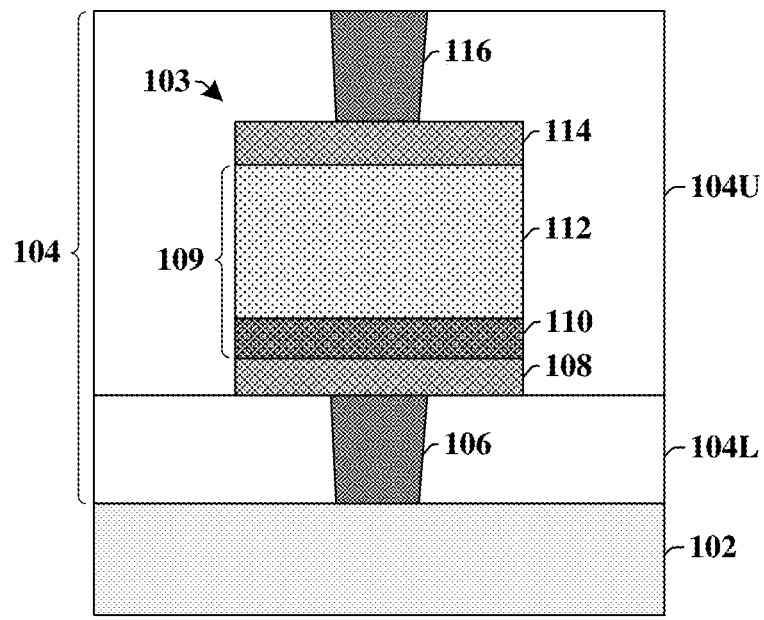
FIG. 1 illustrates a cross-sectional view of some embodiments of an integrated chip having a ferroelectric random access memory (FeRAM) device comprising a data storage structure that includes a seed layer configured to improve performance of the FeRAM device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Ferroelectric random access memory (FeRAM) devices have a bottom electrode that is separated from a top electrode by a data storage structure comprising a ferroelectric material. The ferroelectric material has an intrinsic electric dipole that can be switched between opposite polarities by application of an external electric field. The different polarities provide the FeRAM device with different capacitances, which can be sensed during a read operation by a voltage on a bit-line. The different capacitances are representative of different data states (e.g., a logical '0' or '1'), thereby allowing the FeRAM device to digitally store data.

A read window is a difference in voltages on a bit-line between a low data state (e.g., a logical "0") and a high data state (e.g., a logical "1"). As the size of FeRAM devices decreases, the operating voltages of the FeRAM devices also decreases. The decrease in operating voltages reduces a size of a read window. For example, an FeRAM having a width of approximately 0.27 microns (μm) may have an average overlap between a low voltage state and a high voltage state of approximately 3%, while a smaller FeRAM device having a width of approximately 0.135 μm may have an average overlap between a low voltage state and a high voltage state of approximately 37%. The relatively large overlap of the smaller FeRAM device decreases an ability of a sensing circuitry to differentiate between the low voltage state and the high voltage state during a read operation.

It has been appreciated that some ferroelectric materials (e.g., hafnium zirconium oxide, HfZrO) used within a data storage structure may be formed to have a monoclinic crystal phase. However, the monoclinic crystal phase may have a negative effect on a ferroelectricity of the data storage structure, which may lead to a relatively small read window (i.e., a relatively small difference in bit-line voltages between a low data state and a high data state). During operation of an FeRAM device, a sufficiently large read window is desirable since a large read window makes it easier to differentiate different data states from one another during a read operation.

The present disclosure, in some embodiments, relates to an integrated chip having an FeRAM device comprising a data storage structure having a seed layer with a crystal phase (i.e., a crystal structure) that is configured to improve a ferroelectricity of the data storage structure. In some embodiments, the integrated chip may comprise a bottom electrode disposed over a substrate and a top electrode disposed over the bottom electrode. A data storage structure comprising a ferroelectric switching layer and a seed layer is arranged between the bottom electrode and the top electrode. The seed layer has a crystal phase (e.g., an orthorhombic crystal phase) that is configured to influence a crystal phase of a neighboring region of the ferroelectric switching layer to be a non-monoclinic crystal phase (e.g., to an orthorhombic crystal phase). Influencing the crystal phase of the neighboring region of the ferroelectric switching layer to be a non-monoclinic crystal phase improves a ferroelectricity of the data storage structure and accordingly improves performance (e.g., a read window) of the FeRAM device.

FIG. 1 illustrates a cross-sectional view of some embodiments of an integrated chip 100 having a ferroelectric random access memory (FeRAM) device comprising a data storage structure that includes a seed layer configured to improve performance of the FeRAM device.

The integrated chip 100 comprises an FeRAM device 103 disposed within a dielectric structure 104 over a substrate 102. The dielectric structure 104 comprises a plurality of stacked inter-level dielectric (ILD) layers. In some embodiments, the plurality of stacked ILD layers may comprise one or more lower ILD layers 104L arranged between the FeRAM device 103 and the substrate 102, and an upper ILD layer 104U surrounding the FeRAM device 103. In some embodiments, the one or more lower ILD layers 104L surround a lower interconnect 106 arranged below the FeRAM device 103.

The FeRAM device 103 comprises a bottom electrode 108 coupled to the lower interconnect 106. A data storage structure 109 is arranged between the bottom electrode 108 and a top electrode 114. A top electrode via 116 extends through the upper ILD layer 104U to contact the top electrode 114. The data storage structure 109 comprises a seed layer 110 and a ferroelectric switching layer 112. In some embodiments, the seed layer 110 may be disposed between the ferroelectric switching layer 112 and the bottom electrode 108. In some embodiments, the seed layer 110 directly contacts the ferroelectric switching layer 112.

The seed layer 110 is configured to influence a crystal phase (i.e., a crystal structure) of the ferroelectric switching layer 112 during fabrication of the FeRAM device 103. For example, during fabrication of the FeRAM device 103 the seed layer 110 may be configured to act as a nucleation site that influences a crystal phase of the ferroelectric switching layer 112 (e.g., during epitaxial growth of the ferroelectric switching layer 112, during an anneal process performed after deposition of the ferroelectric switching layer 112, etc.). By influencing the crystal phase of the ferroelectric switching layer 112, the seed layer 110 is able to cause at least a part of the ferroelectric switching layer 112 to have a non-monoclinic crystal phase. It has been appreciated that a ferroelectric switching layer 112 having a non-monoclinic crystal phase will have a higher ferroelectricity than a ferroelectric switching layer 112 having a monoclinic crystal phase, such that the seed layer 110 improves an overall ferroelectricity of the data storage structure 109. Improving a ferroelectricity of the data storage structure 109 improves performance (e.g., a read window) of the FeRAM device 103.

Figure 2A:
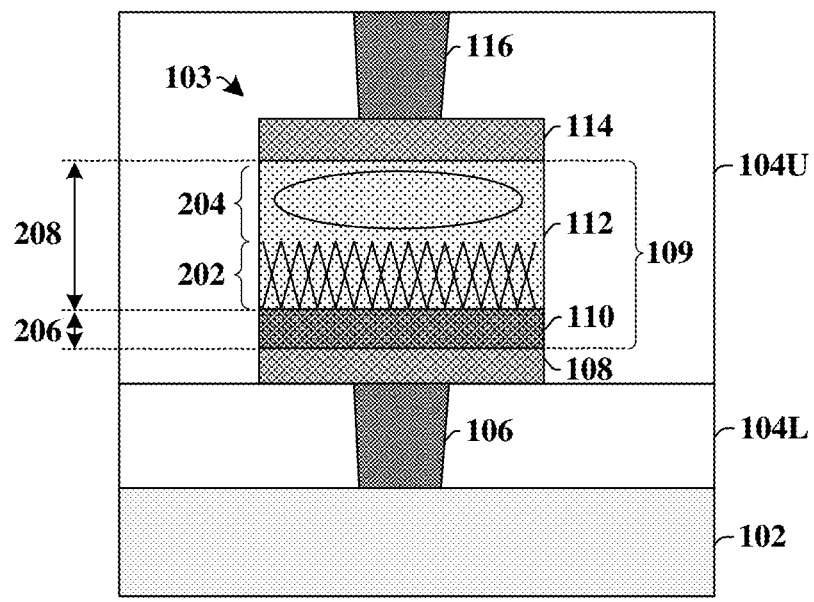
FIGS. 2A-2B illustrate some additional embodiments of an integrated chip having an FeRAM device comprising a data storage structure that includes a seed layer.
Figure 2B:
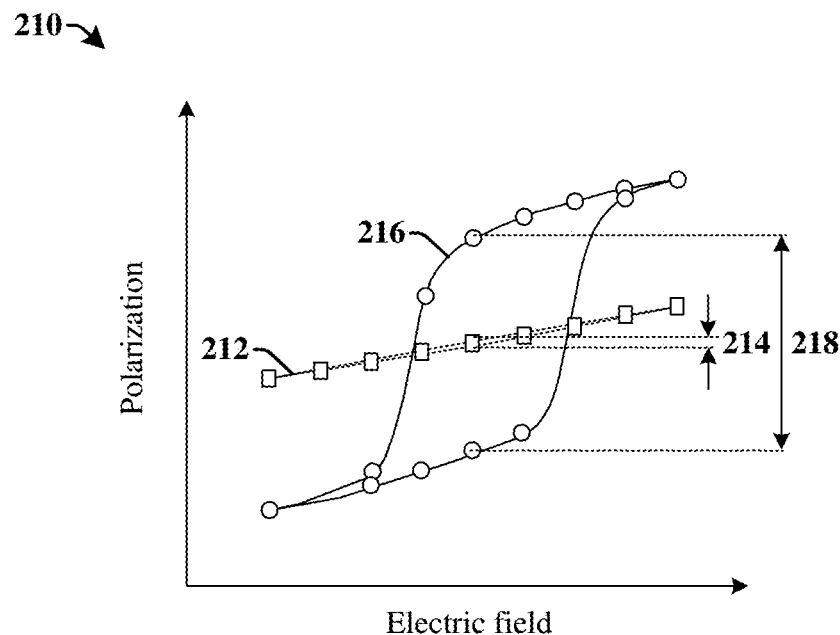

FIGS. 2A-2B illustrate some additional embodiments of an integrated chip having an FeRAM device comprising a data storage structure that includes a seed layer.

FIG. 2A illustrates a cross-sectional view 200 of the integrated chip. As shown in cross-sectional view 200, the integrated chip includes an FeRAM device 103 comprising a data storage structure 109 disposed between a bottom electrode 108 and a top electrode 114. The data storage structure 109 comprises a seed layer 110 and a ferroelectric switching layer 112. The seed layer 110 is disposed on the bottom electrode 108 and the ferroelectric switching layer 112 is disposed on the seed layer 110, so that the seed layer 110 separates the ferroelectric switching layer 112 from the bottom electrode 108.

In some embodiments, the seed layer 110 may comprise a zirconium oxide (e.g., $ZrO_x$), a hafnium oxide (e.g., $HfO_x$), a silicon oxide (e.g., $SiO_x$), a tantalum oxide (e.g., $TaO_x$), an aluminum oxide (e.g., $AlO_x$), a titanium oxide (e.g., $TiO_x$), an yttrium oxide (e.g., $YO_x$), a gadolinium oxide (e.g., $GdO_x$), a lanthanum oxide (e.g., $LaO_x$), a strontium oxide (e.g., $SrO_x$), or the like. In some embodiments, the ferroelectric switching layer 112 may comprise a high-k dielectric material. For example, in some embodiments, the ferroelectric switching layer 112 may comprise hafnium oxide, hafnium zirconium oxide (HZO), lead zirconate titanate (PZT), or the like.

The seed layer 110 comprises a first crystal phase. The ferroelectric switching layer 112 comprises a first region 202 neighboring the seed layer 110 and a second region 204 separated from the seed layer 110 by the first region 202. In some embodiments, the first region 202 contacts the seed layer 110. The first region 202 of the ferroelectric switching layer 112 has the first crystal phase and the second region 204 of the ferroelectric switching layer 112 has a second crystal phase that is different than the first crystal phase. In some embodiments, the first crystal phase is a non-monoclinic crystal phase. For example, in some embodiments, the first crystal phase may comprise an orthorhombic crystal phase, a cubic crystal phase, a tetragonal crystal phase, or the like. In some embodiments, the second crystal phase is a monoclinic crystal phase.

In some embodiments, the seed layer 110 may have a thickness 206 that is between approximately 10 Angstroms (Å) and approximately 40 Å. In other embodiments, the seed layer 110 may have a thickness 206 that is between approximately 20 Å and approximately 30 Å, between approximately 25 Å and approximately 40 Å, or other similar values. If the thickness 206 of the seed layer 110 is greater than approximately 40 Å, the first region 202 of the ferroelectric switching layer 112 is unlikely to have a non-monoclinic crystal phase. In some embodiments, the ferroelectric switching layer 112 may have a thickness 208 in a range of between approximately 50 Å and approximately 500 Å, between 100 Å and approximately 400 Å, or other similar values. In some embodiments, the first region 202 of the ferroelectric switching layer 112 may have a thickness that is between approximately 10% and approximately 100% of the thickness 208, between approximately 20% and approximately 90% of the thickness 208, or other similar values.

In some embodiments, the seed layer 110 may comprise a material having a crystallized temperature (i.e., a temperature at which the material achieves a non-monoclinic phase) that is less than or equal to approximately 800° C. In other embodiments, the seed layer 110 may comprise a material having a crystallized temperature of less than or equal to approximately 500° C., less than or equal to approximately 400° C., or less than or equal to approximately 300° C. Having a relatively low crystallized temperature (e.g., less than or equal to approximately 800° C., less than or equal to approximately 500° C., etc.) allows for the seed layer 110 to be formed to have a non-monoclinic phase without damaging other components on the integrated chip that may be sensitive to high temperatures (e.g., a gate dielectric layer of a transistor device within the substrate 102).

In some embodiments, the seed layer 110 can effect a grain size and/or an orientation of grains (i.e., crystallites) within the ferroelectric switching layer 112. For example, the seed layer 110 may be configured to decrease a grain size of grains within the ferroelectric switching layer 112. For example, for a ferroelectric switching layer 112 comprising a hafnium zirconium oxide ($H_2O$) film with a 1:1 ratio of hafnium and zirconium, the seed layer 110 may result in a grain size of between approximately 0.5 Angstroms (Å) and approximately 20 nanometers (nms), between approximately 1 Å and approximately 10 nms, or other similar values. It has been appreciated that as the grain size of grains within the ferroelectric switching layer 112 decreases, a percent of the ferroelectric switching layer 112 having a non-monoclinic phase may increase. Therefore, in decreasing the grain size of grains within the ferroelectric switching layer 112, the seed layer 110 may decrease a percentage of the ferroelectric switching layer 112 having a monoclinic phase and further increase a performance (e.g., a read window) of the FeRAM device 103.

In some additional and/or alternative embodiments, the seed layer 110 may be configured to change a crystal orientation of the ferroelectric switching layer 112. For example, the seed layer 110 can cause the ferroelectric switching layer 112 to have a crystal phase (i.e., a crystal structure) with a Miller index of (110) or (111). Having a ferroelectric switching layer 112 with a Miller index of (110) or (111) further improves orthorhombic phase growth within the ferroelectric switching layer 112 and further increases a performance (e.g., a read window) of the FeRAM device 103.

During operation, bias voltages applied to the bottom electrode 108 and/or the top electrode 114 act to polarize the data storage structure 109 (e.g., to move ions upward or downward within a crystalline structure of the ferroelectric switching layer). The polarization will remain even after the biases are taken away. The polarization of the data storage structure 109 is representative of a data state (e.g., a logical "0" or "1") stored by the data storage structure 109.

The magnetic response of the data storage structure 109 will follow a hysteresis loop. FIG. 2B illustrates a graph 210 showing an exemplary hysteresis loops corresponding to FeRAM devices having different crystal phases. Graph 210 illustrates a first hysteresis loop 212 corresponding to an FeRAM device having data storage structure that does not comprise a disclosed seed layer (e.g., seed layer 110 of FIG. 2A) and a second hysteresis loop 216 corresponding to an FeRAM device having a disclosed seed layer (e.g., seed layer 110 of FIG. 2A).

As shown by the first hysteresis loop 212, for a data storage structure that does not comprise a seed layer, a difference 214 between a polarization of a high data state and a polarization of a low data state is relatively small. However, as shown by the second hysteresis loop 216, for a data storage structure comprising a seed layer a difference 218 between a polarization of a high data state and a polarization of a low data state is relatively large. The relatively large difference in polarization allows for the high data state to be differentiated from the low data state, thereby improving operation (i.e., a read window) of the FeRAM device.

Figure 3:
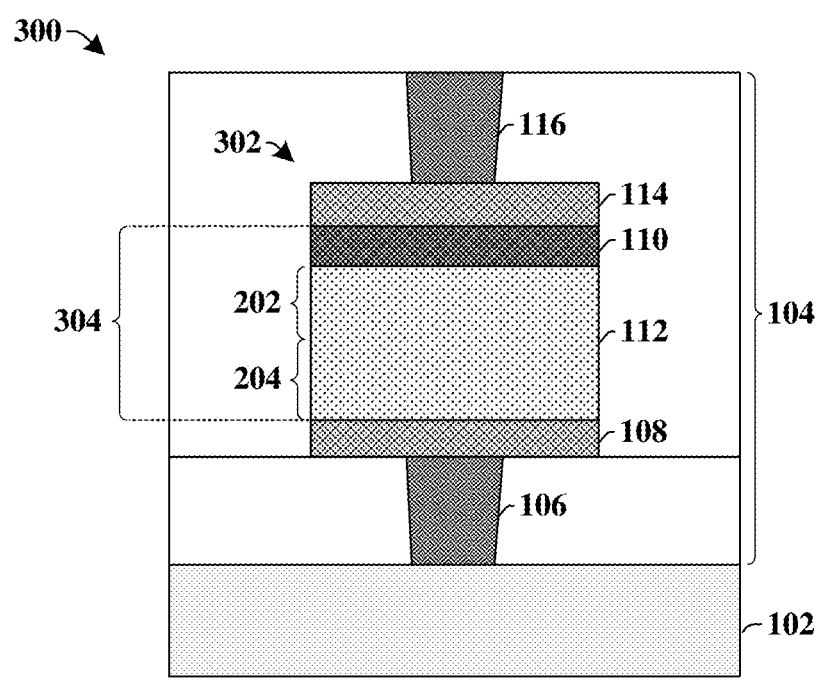
FIG. 3 illustrates a cross-sectional view some additional embodiments of an integrated chip having an FeRAM device comprising a data storage structure that includes a seed layer.

FIG. 3 illustrate a cross-sectional view of some additional embodiments of an integrated chip 300 having an FeRAM device comprising a data storage structure that includes a seed layer.

The integrated chip 300 comprises an FeRAM device 302 disposed within a dielectric structure 104 over a substrate 102. The FeRAM device 302 has a data storage structure 304 disposed between a bottom electrode 108 and a top electrode 114. The data storage structure 304 comprises a ferroelectric switching layer 112 disposed on the bottom electrode 108. A seed layer 110 is disposed on the ferroelectric switching layer 112, so that the ferroelectric switching layer 112 separates the seed layer 110 from the bottom electrode 108. In some embodiments, the ferroelectric switching layer 112 may contact a bottom surface of the seed layer 110. In some embodiments, having a seed layer 110 disposed over the ferroelectric switching layer 112 may simplify fabrication of the FeRAM device 302 by eliminating one or more process steps (e.g., an anneal) used during the fabrication.

The ferroelectric switching layer 112 has a first region 202 and a second region 204. The first region 202 neighbors the seed layer 110, while the second region 204 is separated from the seed layer 110 by the first region 202. In some embodiments, the first region 202 contacts the seed layer 110. The first region 202 has a first crystal phase and the second region 204 has a second crystal phase that is different than the first crystal phase. In some embodiments, the first region 202 may have a non-monoclinic crystal phase, while the second region 204 may have a monoclinic crystal phase.

Figure 4:
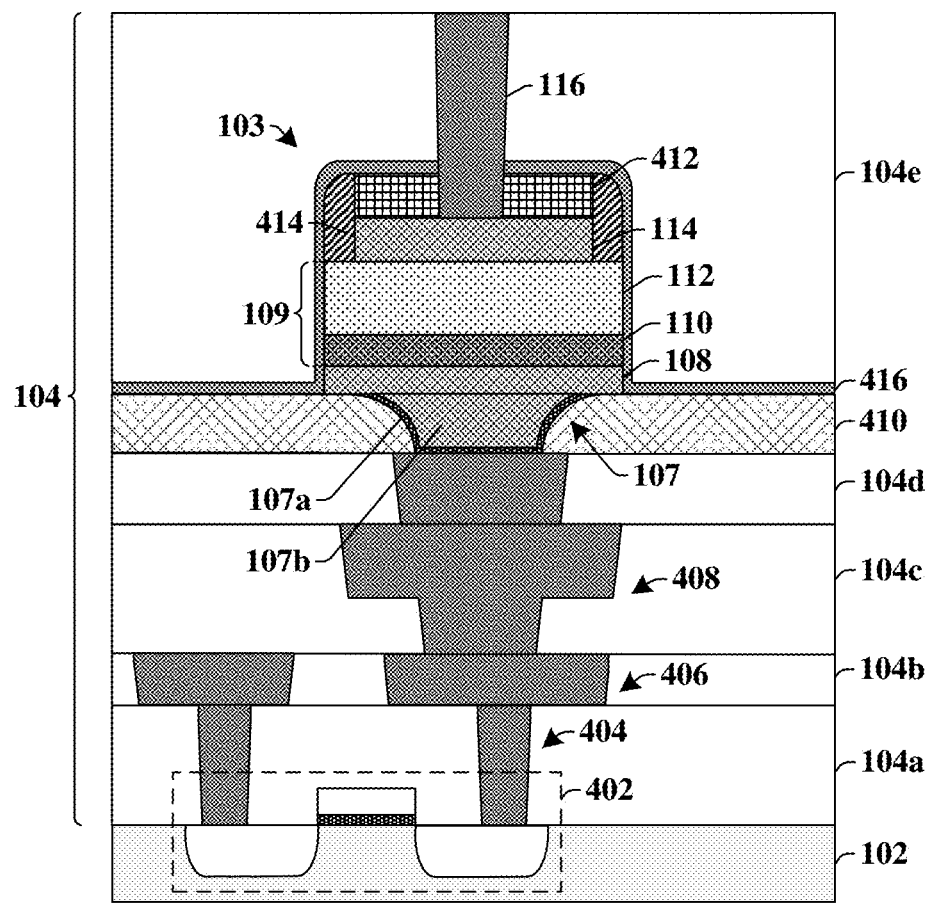
FIG. 4 illustrates a cross-sectional view of a more detailed embodiment of an integrated chip having an FeRAM device comprising a data storage structure that includes a seed layer.

FIG. 4 illustrates a cross-sectional view of a more detailed embodiment of an integrated chip 400 having an FeRAM device comprising a data storage structure that includes a seed layer.

The integrated chip 400 comprises an FeRAM device 103 disposed within a dielectric structure 104 arranged over a substrate 102. In some embodiments, the dielectric structure 104 comprises a plurality of stacked inter-level dielectric (ILD) layers 104a-104e. The plurality of stacked ILD layers 104a-104e comprise one or more lower ILD layers 104a-104d that laterally surround one or more lower interconnect layers 404-408 configured to couple the FeRAM device 103 to an access device 402 arranged within the substrate 102. In some embodiments, the one or more lower interconnect layers 404-408 may comprise conductive contacts 404, interconnect wires 406, and interconnect vias 408. In some embodiments, the access device 402 may comprise a transistor device (e.g., a MOSFET device, a BJT, or the like).

In some embodiments, a lower insulating structure 410 is disposed over the one or more lower ILD layers 104a-104d. The lower insulating structure 410 comprises sidewalls that form an opening extending through the lower insulating structure 410. In various embodiments, the lower insulating structure 410 may comprise one or more of silicon nitride, silicon dioxide, silicon carbide, or the like. In some embodiments, an upper insulating structure 416 is disposed over the FeRAM device 103 and on the lower insulating structure 410. The upper insulating structure 416 continuously extends from a first position directly over the FeRAM device 103 to a second position abutting an upper surface of the lower insulating structure 410. The upper insulating structure 416 separates the FeRAM device 103 from an upper ILD layer 104e. In some embodiments, the upper insulating structure 416 may comprise one or more of silicon nitride, silicon dioxide, silicon carbide, Tetraethyl orthosilicate (TEOS), or the like.

A bottom electrode via 107 extends through the lower insulating structure 410. In some embodiments, the bottom electrode via 107 may comprise a diffusion barrier layer 107a and a bottom electrode via layer 107b over the diffusion barrier layer 107a. The FeRAM device 103 is arranged over the bottom electrode via 107 and the lower insulating structure 410. In some embodiments, the FeRAM device 103 comprises a bottom electrode 108 that is separated from a top electrode 114 by way of a data storage structure 109. In some embodiments, the data storage structure 109 may comprise a seed layer 110 and a ferroelectric switching layer 112.

In some embodiments, a hard mask 412 may be disposed on the top electrode 114. One or more sidewall spacers 414 may be disposed on opposing sides of the top electrode 114 and the hard mask 412. In some embodiments, the hard mask 412 may comprise a metal (e.g., titanium, tantalum, or the like) and/or a dielectric (e.g., a nitride, a carbide, or the like). In some embodiments, the one or more sidewall spacer 414 may comprise an oxide (e.g., silicon rich oxide), a nitride (e.g., silicon nitride), a carbide (e.g., silicon carbide), or the like. A top electrode via 116 extends through the upper ILD layer 104e and the hard mask 412 to electrically contact the top electrode 114.

Figure 5A:
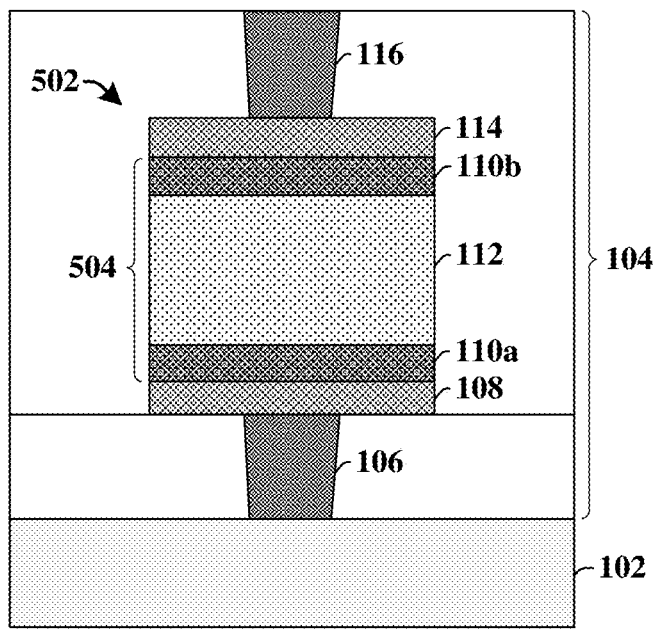
FIGS. 5A-6 illustrate cross-sectional views of additional embodiments of integrated chips having an FeRAM device comprising a data storage structure that includes one or more seed layers.
Figure 5B:
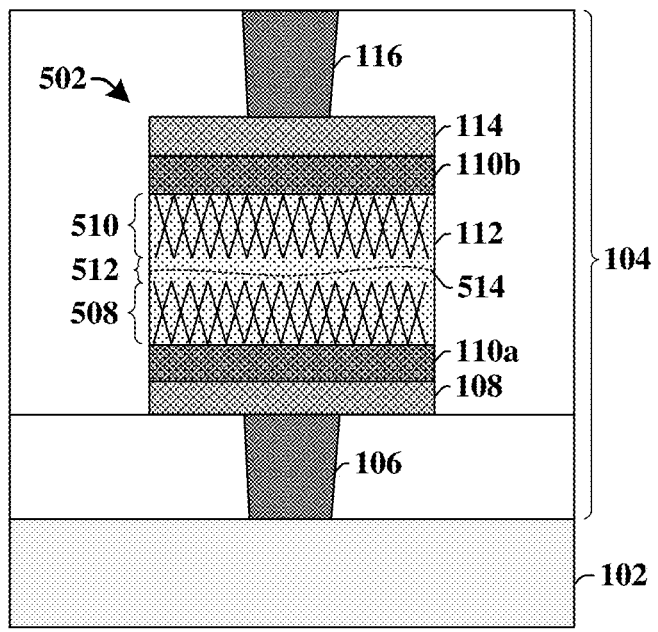

FIGS. 5A-5B illustrate cross-sectional views of some additional embodiments of an integrated chip 500 having an FeRAM device comprising a data storage structure that includes dual seed layers.

The integrated chip 500 comprises an FeRAM device 502 disposed within a dielectric structure 104 over a substrate 102. The FeRAM device 502 has a data storage structure 504 disposed between a bottom electrode 108 and a top electrode 114. The data storage structure 504 comprises a first seed layer 110a disposed on the bottom electrode 108, a ferroelectric switching layer 112 disposed on the first seed layer 110a, and a second seed layer 110b disposed on the ferroelectric switching layer 112. The ferroelectric switching layer 112 is disposed between the first seed layer 110a and the second seed layer 110b.

The first seed layer 110a and the second seed layer 110b have a non-monoclinic crystal phase. In some embodiments, the first seed layer 110a and the second seed layer 110b comprise a same material. For example, in some embodiments, the first seed layer 110a and the second seed layer 110b may both comprise zirconium oxide (e.g., $ZrO_2$). In other embodiments, the first seed layer 110a and the second seed layer 110b may comprise different materials. For example, in some embodiments, the first seed layer 110a may comprise zirconium oxide and the second seed layer 110b may comprise hafnium oxide. In some such embodiments, the first seed layer 110a may have a first non-monoclinic crystal phase (e.g., an orthorhombic crystal phase) and the second seed layer 110b may have a second non-monoclinic crystal phase (e.g., a cubic crystal phase).

FIG. 5B illustrates a cross-sectional view 506 of the integrated chip 500 of FIG. 5A illustrating regions having different crystal phases.

As shown in cross-sectional view 506, the ferroelectric switching layer 112 comprises a first region 508 and a second region 510. The first region 508 neighbors the first seed layer 110a and the second region 510 neighbors the second seed layer 110b. During fabrication of the FeRAM device 502, the first seed layer 110a will influence a crystal phase of the first region 508 to give the first region 508 a non-monoclinic crystal phase. Similarly, the second seed layer 110b will influence a crystal phase of the second region 510 to give the second region 510 a non-monoclinic crystal phase. In some embodiments, the first region 508 and the second region 510 may have a same non-monoclinic crystal phase. In other embodiments, the first region 508 may have a first non-monoclinic crystal phase (e.g., an orthorhombic crystal phase) and the second region 510 may have a second non-monoclinic crystal phase (e.g., a cubic crystal phase).

In some embodiments, the ferroelectric switching layer 112 may further comprise a third region 512 separating the first region 508 from the second region 510. The third region 512 may have a monoclinic phase. In other embodiments, the first region 508 may meet the second region 510 along an interface 514 comprising a crystalline boundary. In such embodiments, all or substantially all of the ferroelectric switching layer 109 has a non-monoclinic crystal phase. By having the first seed layer 110a and the second seed layer 110b disposed on opposing sides of the ferroelectric switching layer 112, the first seed layer 110a and the second seed layer 110b can modify a crystal phase for a large amount of the ferroelectric switching layer 112 and thereby minimize a size of or eliminate the third region 512 to improve performance (e.g., a read window) of the FeRAM device 502.

Figure 6:
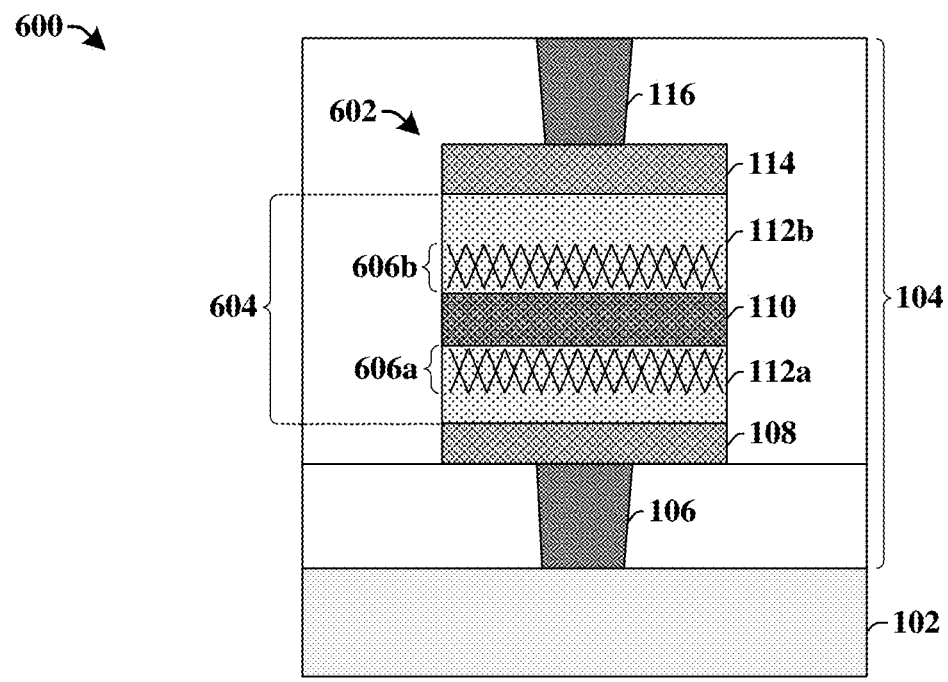

FIG. 6 illustrate a cross-sectional view of some additional embodiments of an integrated chip 600 having an FeRAM device comprising a data storage structure that includes a seed layer.

The integrated chip 600 comprises an FeRAM device 602 disposed within a dielectric structure 104 over a substrate 102. The FeRAM device 602 comprises a data storage structure 604 disposed between a bottom electrode 108 and a top electrode 114. The data storage structure 604 comprises a seed layer 110 disposed between a first ferroelectric switching layer 112a and a second ferroelectric switching layer 112b. In some embodiments, the first ferroelectric switching layer 112a contacts a lower surface of the seed layer 110 and the second ferroelectric switching layer 112b contacts an upper surface of the seed layer 110. Having the seed layer 110 between the first ferroelectric switching layer 112a and the second ferroelectric switching layer 112b allows for the seed layer 110 to influence a crystal phase of both the first ferroelectric switching layer 112a and the second ferroelectric switching layer 112b.

For example, the seed layer 110 may form a first region 606a within the first ferroelectric switching layer 112a having a non-monoclinic crystal phase and a second region 606b within the second ferroelectric switching layer 112b having a non-monoclinic crystal phase. By influencing the crystal phase of both the first ferroelectric switching layer 112a and the second ferroelectric switching layer 112b, the seed layer 110 is able to further improve performance of the FeRAM device 602.

Figure 7A:
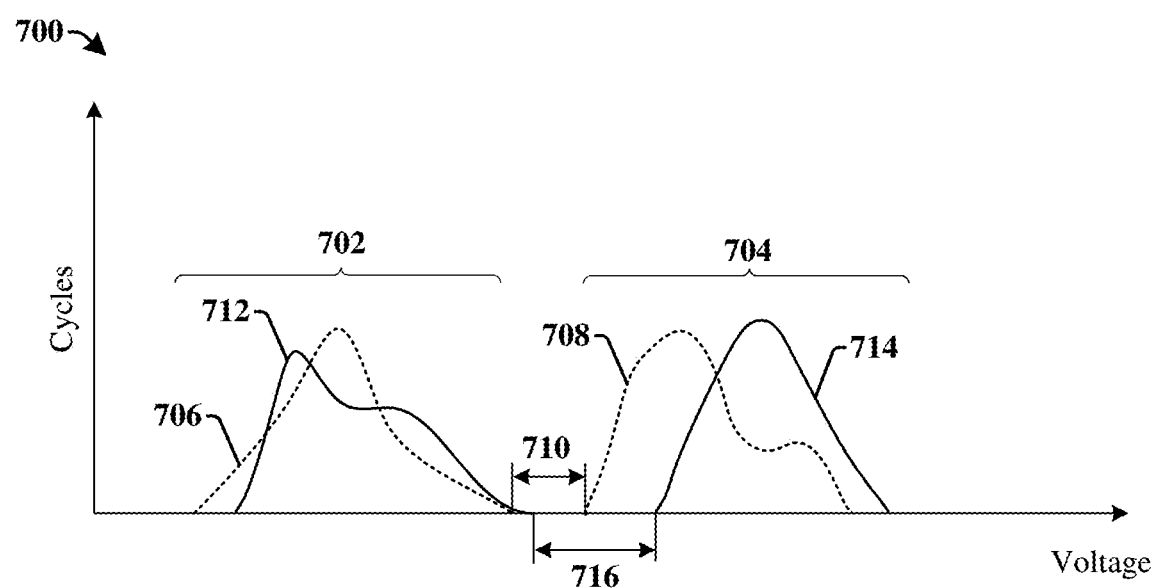
FIGS. 7A-7B illustrate graphs showing read windows of FeRAM devices having different data storage structures.
Figure 7B:
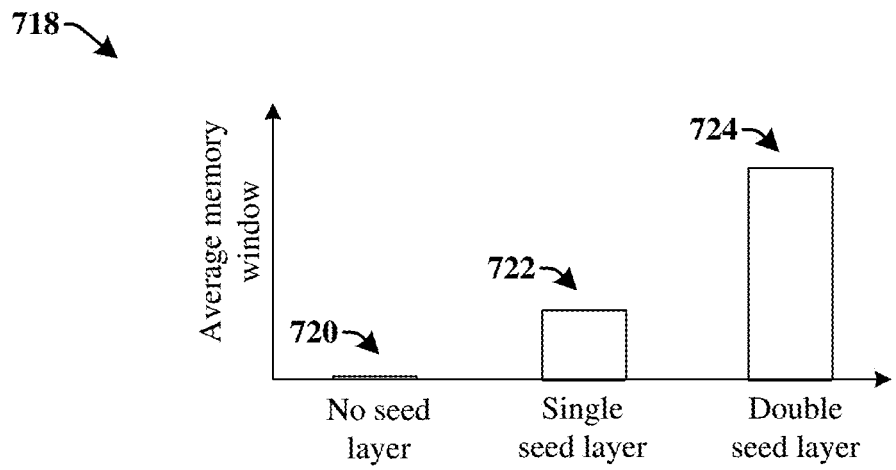

FIGS. 7A-7B illustrate graphs showing read windows of FeRAM devices having different data storage structures.

FIG. 7A illustrates a graph 700 showing voltage values corresponding to a first data state (e.g., a low data state having a logical "0") and a second data state (e.g., a high data state having a logic "1") as a function of operating cycles. A first range of voltages 702 corresponds to a first data state and a second range of voltages 704 corresponds to a second data state. For an FeRAM having a single seed layer (e.g., as shown in FIG. 1), voltage values corresponding to a first data state 706 are separated from voltage values corresponding to a second data state 708 by a first memory window 710. For an FeRAM having a double seed layer (e.g., as shown in FIG. 5A), voltage values corresponding to a first data state 712 are separated from voltage values corresponding to a second data state 714 by a second memory window 716 that is larger than the first memory window 710.

FIG. 7B illustrates a graph 718 showing an average memory window over 10,000 operating cycles for an FeRAM device having no seed layer 720, for an FeRAM device having a single seed layer 722, and for an FeRAM device having a double (i.e., dual) seed layer 724. As shown in graph 718, an average memory window for the FeRAM device having no seed layer 720 is equal to approximately 0 V, so that an average difference between a first data state and a second data state is equal to approximately 0 V. An average memory window for the FeRAM device having a single seed layer 722 is equal to approximately 0.1 V, so that an average difference between a first data state and a second data state is equal to approximately 0.1 V. An average memory window for the FeRAM device having a double seed layer 724 is equal to approximately 0.3 V, so that an average difference between a first data state and a second data state is equal to approximately 0.3 V. Therefore, graphs 700 and 718 illustrate that the disclosed seed layer(s) improve(s) a memory window for FeRAM devices, thereby improving performance of the FeRAM devices.

FIGS. 8-21 illustrate cross-sectional views of some embodiments of a method of forming an integrated chip having an FeRAM device comprising a data storage structure that includes a seed layer. Although FIGS. 8-21 are described in relation to a method, it will be appreciated that the structures disclosed in FIGS. 8-21 are not limited to such a method, but instead may stand alone as structures independent of the method.

Figure 8:
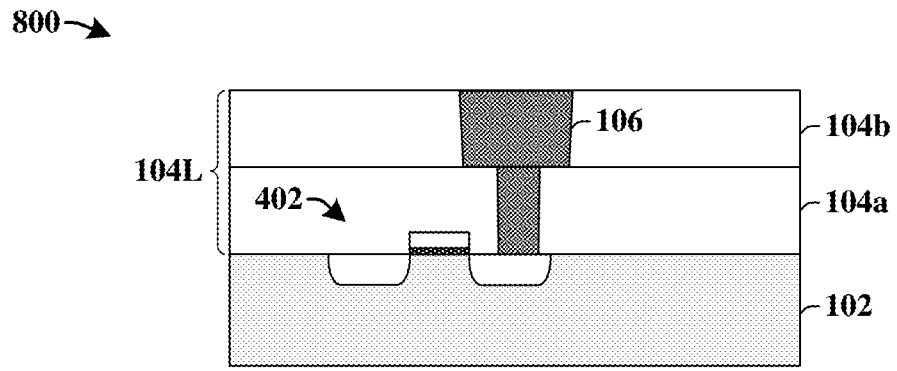
FIGS. 8-21 illustrate cross-sectional views of some embodiments of a method of forming an integrated chip having an FeRAM device comprising a data storage structure that includes a seed layer.

As shown in cross-sectional view 800 of FIG. 8, a substrate 102 is provided. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, an access device 402 is formed on and/or within the substrate 102. In some embodiments, the access device 402 may comprise a transistor. In some such embodiments, the access device 402 may be formed by depositing a gate dielectric film and a gate electrode film over the substrate 102. The gate dielectric film and the gate electrode film are subsequently patterned to form a gate dielectric and a gate electrode. The substrate 102 may be subsequently implanted to form a source region and a drain region within the substrate 102 on opposing sides of the gate electrode.

In some embodiments, a lower interconnect 106 may be formed within one or more lower ILD layers 104L formed over the substrate 102. In some embodiments, the one or more lower ILD layers 104L may comprise a first lower ILD layer 104a and a second lower ILD layer 104b. In some embodiments, the lower interconnect 106 may comprise a conductive contact, an interconnect wire, or an interconnect via. The lower interconnect 106 may be formed by forming a lower ILD layer of the one or more lower ILD layers 104a-104b (e.g., an oxide, a low-k dielectric, or an ultra low-k dielectric) over the substrate 102, selectively etching the lower ILD layer to form a via hole and/or a trench within the lower ILD layer, forming a conductive material (e.g., copper, aluminum, etc.) within the via hole and/or the trench, and performing a planarization process (e.g., a chemical mechanical planarization process) to remove excess of the conductive material from over the lower ILD layer.

Figure 9:
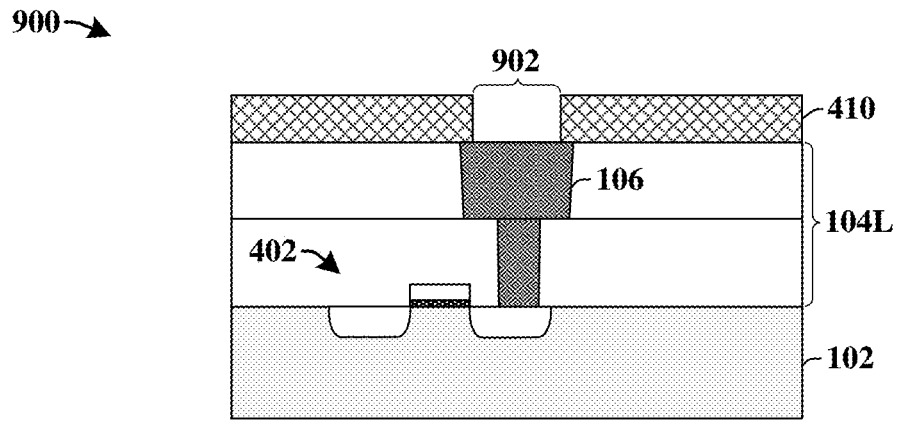

As shown in cross-sectional view 900 of FIG. 9, a lower insulating structure 410 is formed over the lower interconnect 106. In some embodiments, the lower insulating structure 410 comprises one or more of silicon rich oxide, silicon carbide, silicon nitride, or the like. In some embodiments, the lower insulating structure 410 may be formed by one or more deposition processes (e.g., a physical vapor deposition (PVD) process, a chemical vapor deposition (CVD) process, a plasma enhanced CVD (PE-CVD) process, or the like). In some embodiments, the lower insulating structure 410 is selectively etched to form an opening 902 that extends through the lower insulating structure 410 to expose an upper surface of the lower interconnect 106.

Figure 10:
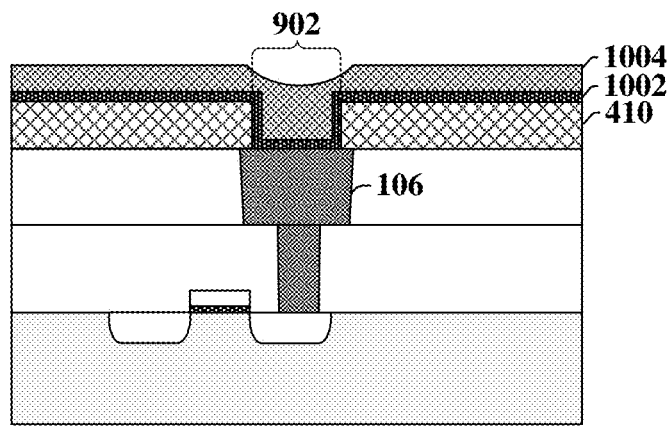

As shown in cross-sectional view 1000 of FIG. 10, a diffusion barrier layer 1002 is formed within the opening 902. In some embodiments, a bottom electrode via layer 1004 is formed over the diffusion barrier layer 1002. In some embodiments, the diffusion barrier layer 1002 may comprise a metal nitride, such as titanium nitride, tantalum nitride, or the like. In some embodiments, the bottom electrode via layer 1004 may comprise a metal, a metal nitride, or the like. For example, the bottom electrode via layer 1004 may comprise tungsten, tantalum nitride, titanium nitride, ruthenium, platinum, iridium, or the like. In some embodiments, the diffusion barrier layer 1002 and the bottom electrode via layer 1004 may be formed by deposition processes (e.g., a PVD process, a CVD process, a PE-CVD process, or the like).

Figure 11:
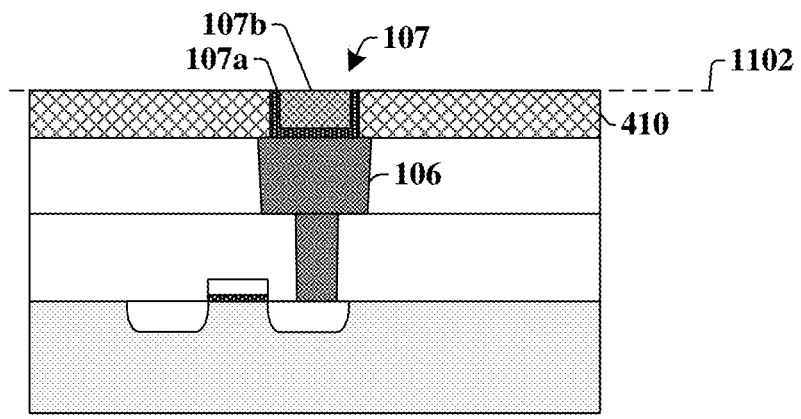

As shown in cross-sectional view 1100 of FIG. 11, a planarization process (e.g., a chemical mechanical planarization (CMP) process) may be performed (along line 1102) after forming the bottom electrode via layer 1004. In some embodiments, the planarization process may remove excess material of the diffusion barrier layer 107a and/or the bottom electrode via layer 107b from over a top of the lower insulating structure 410 to form a bottom electrode via 107 over the lower interconnect 106.

Figure 12:
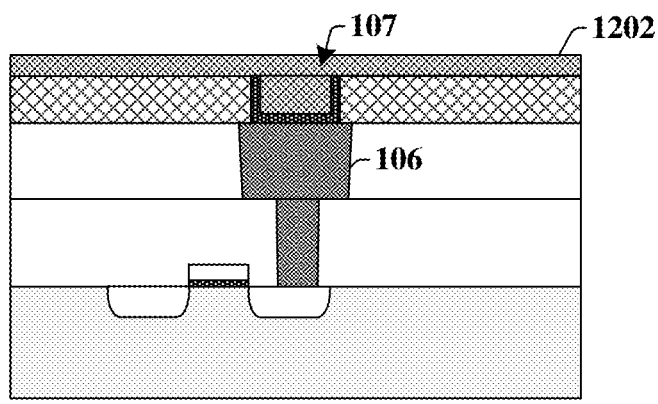

As shown in cross-sectional view 1200 of FIG. 12, a bottom electrode layer 1202 is formed over the bottom electrode via 107. In some embodiments, the bottom electrode layer 1202 may comprise tungsten, tantalum, tantalum nitride, titanium, titanium nitride, ruthenium, platinum, iridium, or the like. In some embodiments, the bottom electrode layer 1202 may be formed by a deposition process (e.g., a PVD process, a CVD process, a PE-CVD process, or the like).

Figure 13:
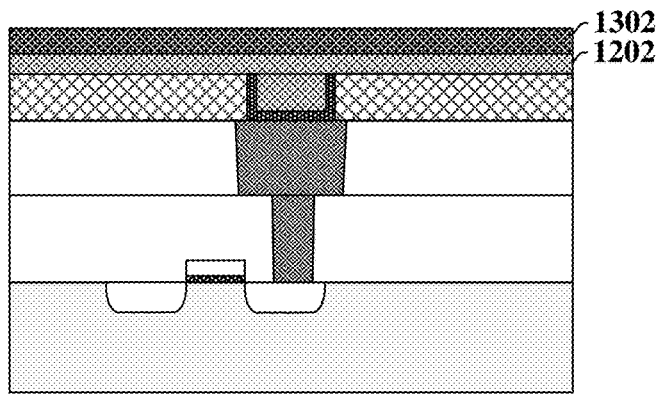

As shown in cross-sectional view 1300 of FIG. 13, a seed layer 1302 is formed over the bottom electrode layer 1202. In various embodiments, the seed layer 1302 may comprise a zirconium oxide (e.g., $ZrO_x$), a hafnium oxide (e.g., $HfO_x$), a silicon oxide (e.g., $SiO_x$), a tantalum oxide (e.g., $TaO_x$), an aluminum oxide (e.g., $AlO_x$), a titanium oxide (e.g., $TiO_x$), an yttrium oxide (e.g., $YO_x$), a gadolinium oxide (e.g., $GdO_x$), a lanthanum oxide (e.g., $LaO_x$), a strontium oxide (e.g., $SrO_x$), or the like. In some embodiments, the seed layer 1302 may be formed by a deposition process (e.g., a PVD process, a CVD process, a PE-CVD process, or the like).

In some embodiments, the seed layer 1302 may be formed at a relatively high temperature that causes the seed layer 1302 to have a non-monoclinic crystal phase (e.g., an orthorhombic crystal phase, a cubic crystal phase, or the like). For example, in some embodiments the seed layer 1302 may be formed at a temperature of approximately 300° C., less than or equal to approximately 400° C., less than or equal to approximately 500° C., or other similar values. In other embodiments, a first anneal process may be performed after deposition of the seed layer 1302. The first anneal process changes a crystal phase of the seed layer 1302 to a non-monoclinic crystal phase (e.g., to an orthorhombic crystal phase). In some embodiments, the first anneal process may be performed at a temperature of approximately 300° C., less than or equal to approximately 400° C., less than or equal to approximately 500° C., between approximately 300° C. and approximately 500° C., or other similar values.

Figure 14:
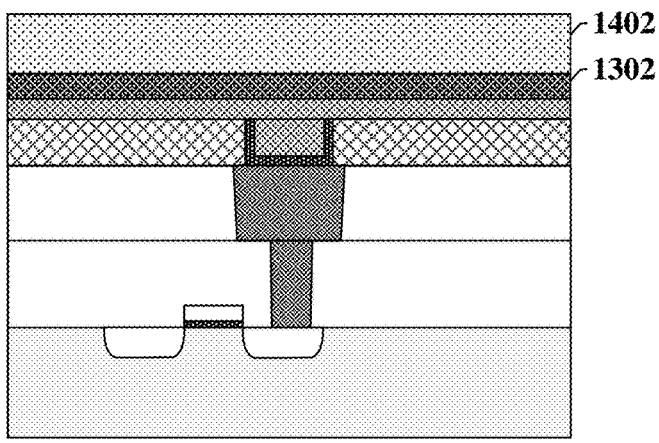

As shown in cross-sectional view 1400 of FIG. 14, a ferroelectric switching layer 1402 is formed onto the seed layer 1302. In some embodiments, the ferroelectric switching layer 1402 may comprise hafnium oxide, hafnium zirconium oxide (HZO), lead zirconate titanate (PZT), or the like. In some embodiments, the ferroelectric switching layer 1402 may be formed by a deposition process (e.g., a PVD process, a CVD process, a PE-CVD process, or the like). In some embodiments, the ferroelectric switching layer 1402 may be deposited having a monoclinic crystal phase. In some embodiments, a second anneal process may be performed after deposition of the ferroelectric switching layer 1402 to change a crystal phase of a part or all of the ferroelectric switching layer 1402 to a non-monoclinic crystal phase. In some embodiments, the second anneal process may be performed at a temperature of approximately 300° C., less than or equal to approximately 400° C., less than or equal to approximately 500° C., between approximately 300° C. and approximately 500° C., or other similar values.

Figure 15:
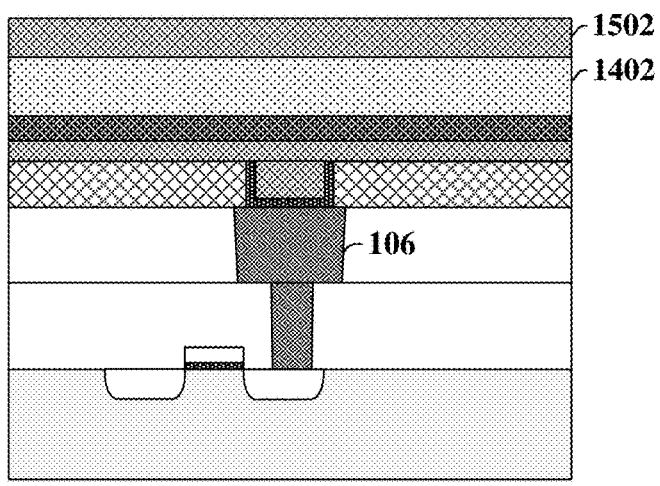

As shown in cross-sectional view 1500 of FIG. 15, a top electrode layer 1502 is formed over the ferroelectric switching layer 1402. The top electrode layer 1502 may comprise a metal, a metal nitride, or the like. In some embodiments, the top electrode layer 1502 may comprise tungsten, tantalum, tantalum nitride, titanium, titanium nitride, ruthenium, platinum, iridium, or the like. In some embodiments, the top electrode layer 1502 may be formed by a deposition process (e.g., a PVD process, a CVD process, a PE-CVD process, or the like). In some embodiments, the second anneal process may be performed after deposition of the top electrode layer 1502. Performing the second anneal process after deposition of the top electrode layer 1502 can cause the top electrode layer 1502 to induce a tensile stress upon the ferroelectric switching layer 1402. The tensile stress increases a change of a crystal phase of the ferroelectric switching layer 1402 to a non-monoclinic crystal phase, so as to result in a ferroelectric switching layer 1402 having a higher percentage of non-monoclinic phase.

Figure 16:
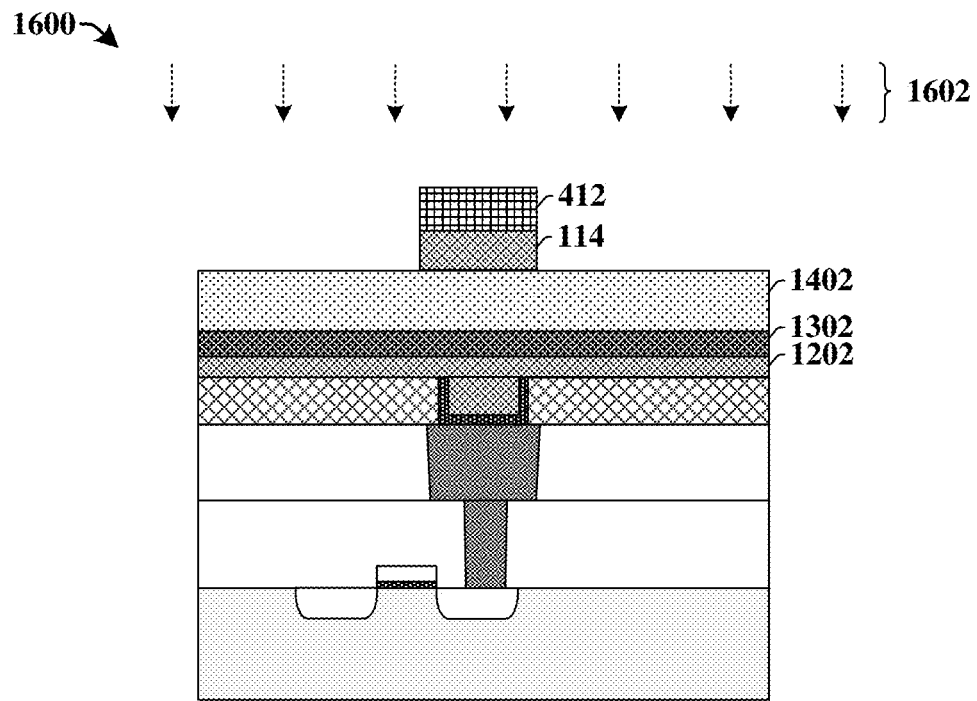

As shown in cross-sectional view 1600 of FIG. 16, a first patterning process is performed on the top electrode layer (1502 of FIG. 15) to form a top electrode 114. In some embodiments, the first patterning process selectively exposes the top electrode layer (1502 of FIG. 15) to a first etchant 1602 according to a hard mask 412 to form the top electrode 114. In various embodiments, the hard mask 412 may comprise a metal (e.g., titanium, titanium nitride, tantalum, or the like) and/or a dielectric material (e.g., silicon-nitride, silicon-carbide, or the like). In other embodiments (not shown), the first patterning process may selectively expose the top electrode layer (1502 of FIG. 15) to the first etchant 1602 according to a photosensitive material (e.g., photoresist).

Figure 17:
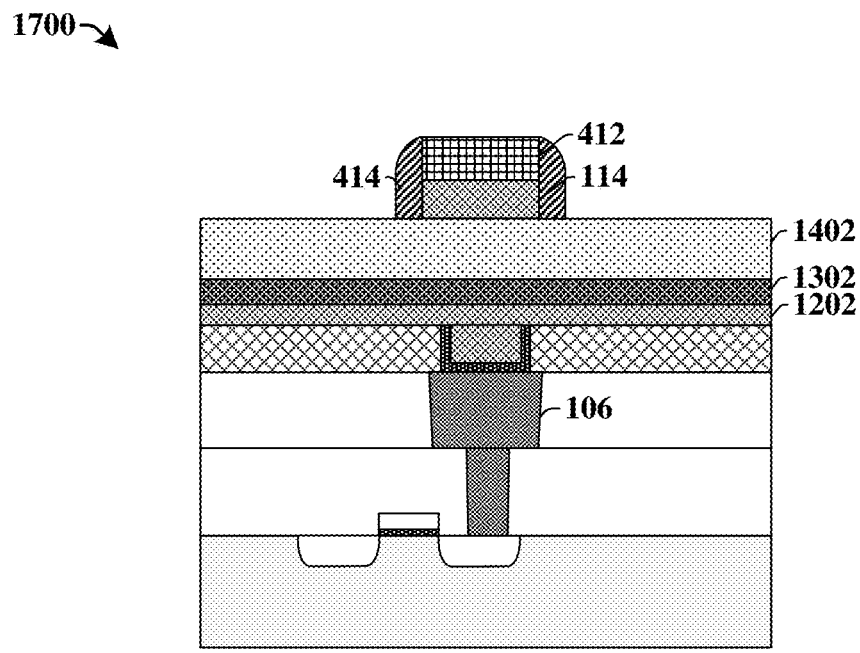

As shown in cross-sectional view 1700 of FIG. 17, one or more sidewall spacers 414 are formed along sidewalls of the top electrode 114 and the hard mask 412. In various embodiments, the one or more sidewall spacers 414 may comprise silicon nitride, silicon dioxide, silicon oxynitride, and/or the like. In some embodiments, the one or more sidewall spacers 414 may be formed by forming a spacer layer over the substrate 102. The spacer layer is subsequently exposed to an etchant (e.g., a dry etchant), which removes the spacer layer from horizontal surfaces. Removing the spacer layer from the horizontal surfaces leaves a part of the spacer layer along opposing sidewalls of the top electrode 114 and the hard mask 412 as the one or more sidewall spacers 414.

Figure 18:
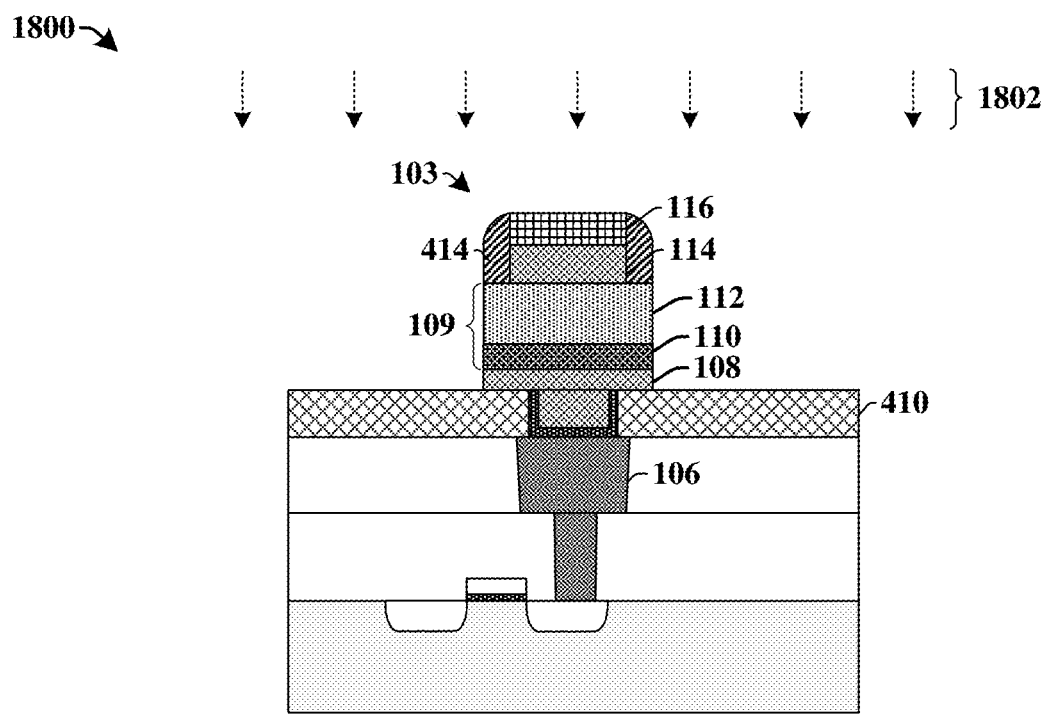

As shown in cross-sectional view 1800 of FIG. 18, a second patterning process is performed on the ferroelectric switching layer (1402 of FIG. 17), the seed layer (1302 of FIG. 17), and the bottom electrode layer (1202 of FIG. 17). The second patterning process forms an FeRAM device 103 having a data storage structure 109 comprising a seed layer 110 and a ferroelectric switching layer 112 disposed between a bottom electrode 108 and the top electrode 114. In some embodiments, the second patterning process selectively exposes the ferroelectric switching layer (1402 of FIG. 17), the seed layer (1302 of FIG. 17), and the bottom electrode layer (1202 of FIG. 17) to a second etchant 1802 in areas that are not covered by the hard mask 412 and the one or more sidewall spacers 414.

Figure 19:
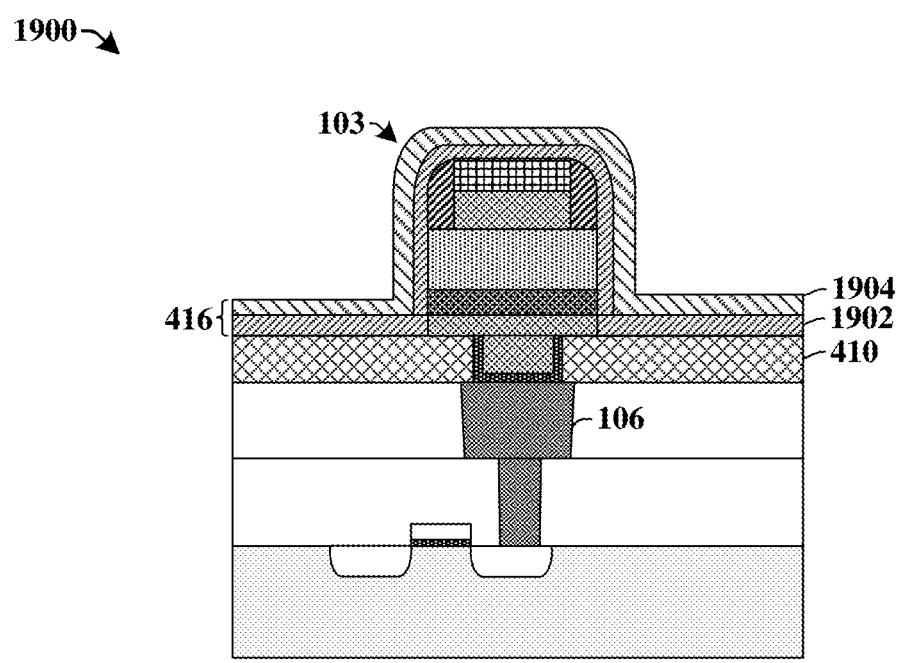

As shown in cross-sectional view 1900 of FIG. 19, an upper insulating structure 416 is formed over the FeRAM device 103. In some embodiments, the upper insulating structure 416 comprises a plurality of different stacked dielectric materials. For example, in some embodiments, the upper insulating structure 416 comprises a first dielectric layer 1902 and a second dielectric layer 1904 over the first dielectric layer 1902. In some embodiments, the first dielectric layer 1902 may comprise silicon rich oxide, silicon carbide, silicon nitride, tetraethyl orthosilicate (TEOS), or the like. In some embodiments, the second dielectric layer 1904 may comprise silicon carbide, silicon nitride, or the like. In some embodiments, the upper insulating structure 416 may be formed using one or more deposition processes (e.g., PVD, CVD, PE-CVD, ALD, sputtering, etc.).

Figure 20:
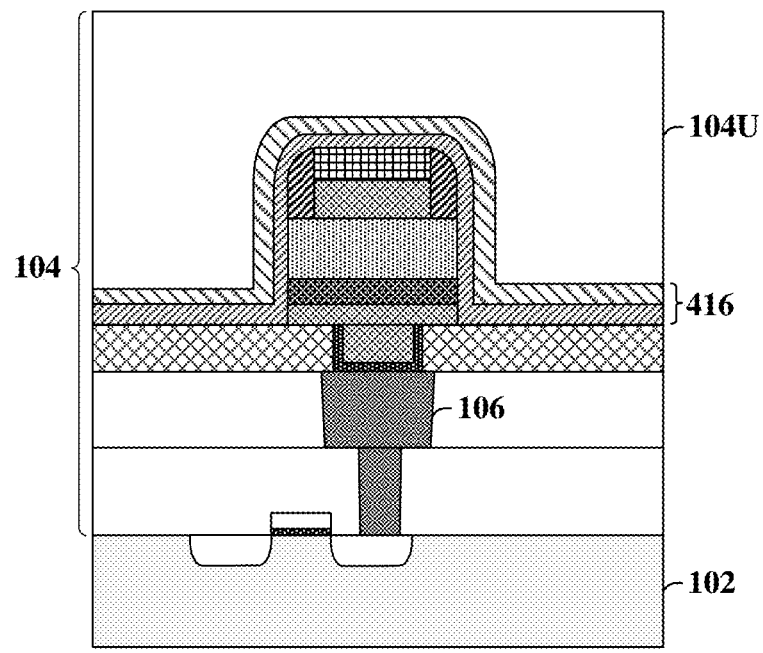

As shown in cross-sectional view 2000 of FIG. 20, an upper ILD layer 104U is formed over the upper insulating structure 416 to form a dielectric structure 104 over the substrate 102. In some embodiments, the upper ILD layer 104U may be formed by a deposition process (e.g., PVD, CVD, PE-CVD, ALD, or the like). In various embodiments, the upper ILD layer 104U may comprise one or more of silicon dioxide, carbon doped silicon dioxide, silicon oxynitride, borosilicate glass (BSG), phosphorus silicate glass (PSG), borophosphosilicate glass (BPSG), fluorosilicate glass (FSG), undoped silicate glass (USG), a porous dielectric material, or the like.

Figure 21:
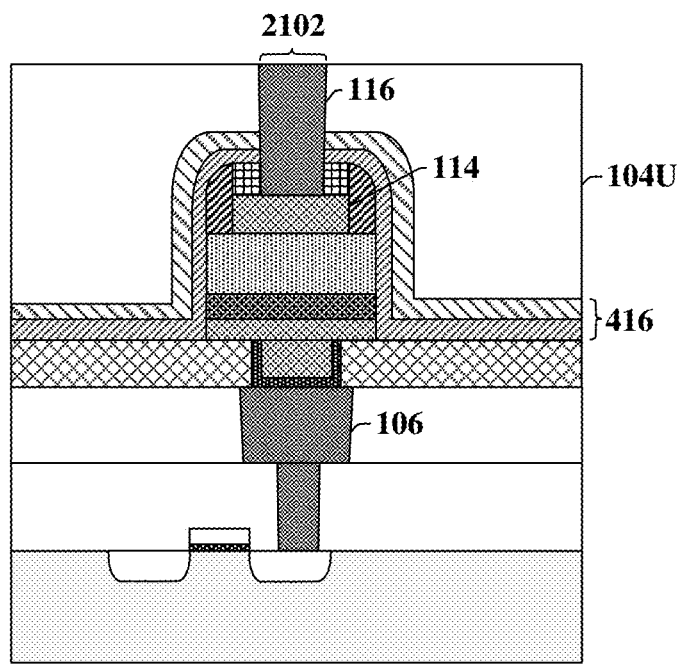

As shown in cross-sectional view 2100 of FIG. 21, a top electrode via 116 is formed on the top electrode 114. The top electrode via 116 extends through the upper ILD layer 104U and the upper insulating structure 416 to the top electrode 114. In some embodiments, the top electrode via 116 may be formed by selectively etching the upper ILD layer 104U and the upper insulating structure 416 to form a via hole 2102 that extends from a top surface of the upper ILD layer 104U to expose an upper surface of the top electrode 114. In some embodiments, the via hole 2102 may be formed by a third patterning process that uses a third etchant to selectively etch the upper ILD layer 104U according to a masking layer. A conductive material (e.g., copper, aluminum, etc.) is formed within the a via hole 2102. In some embodiments, after forming the conductive material within the via hole 2102 a planarization process (e.g., a CMP process) is performed to remove excess of the conductive material from over a top of the upper ILD layer 104U.

Figure 22:
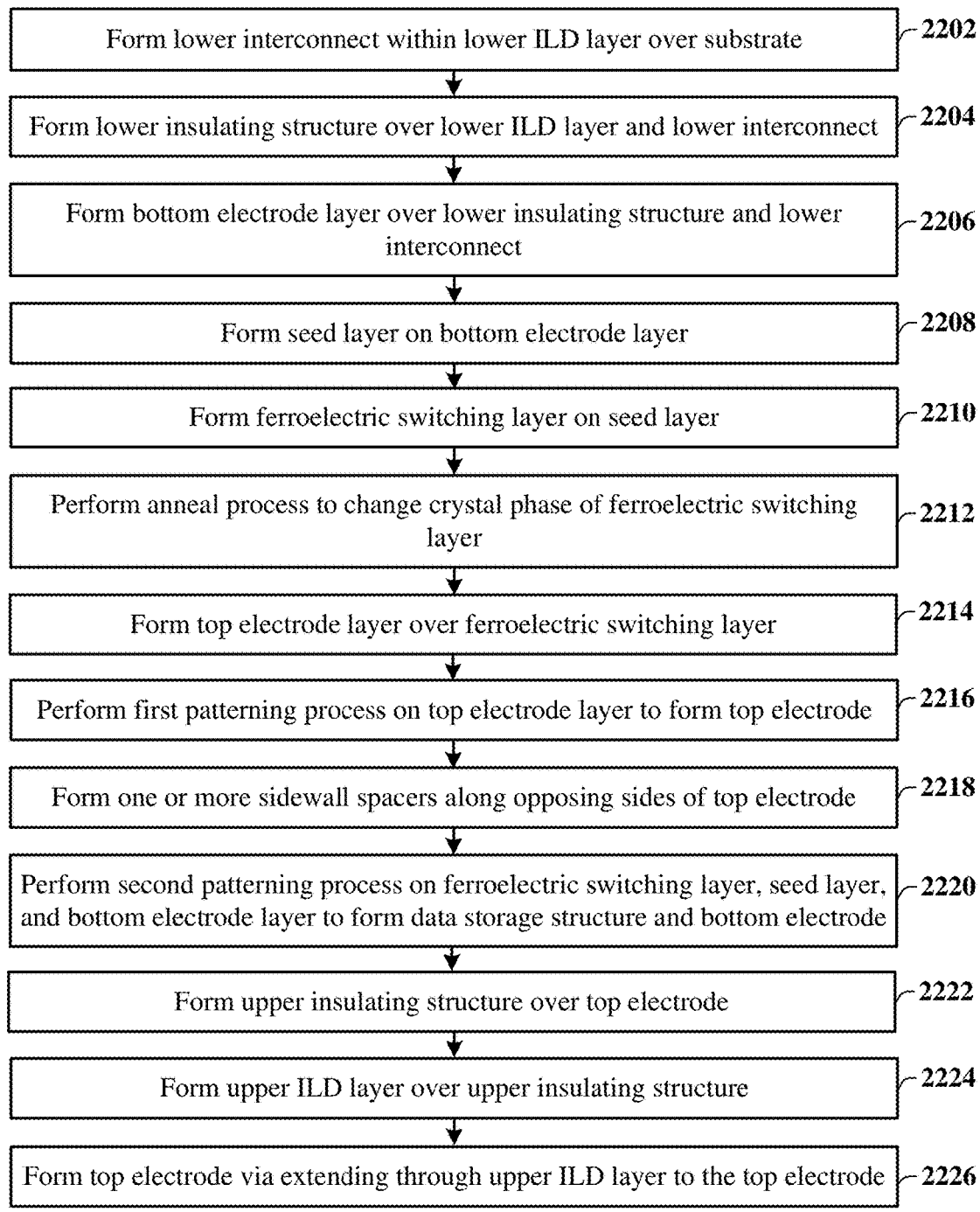
FIG. 22 illustrates a flow diagram of some embodiments of a method of forming an integrated chip having an FeRAM device comprising a data storage structure that includes a seed layer.

FIG. 22 illustrates a flow diagram of some embodiments of a method 2200 of forming an integrated chip having an FeRAM device comprising a data storage structure that includes a seed layer.

While the methods (e.g., methods 2200, 3100, 4000, and 4900) is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2202, a lower interconnect is formed within a lower inter-level dielectric (ILD) layer over a substrate. FIG. 8 illustrates a cross-sectional view 800 of some embodiments corresponding to act 2202.

At act 2204, a lower insulating structure is formed over the lower ILD layer and the lower interconnect. FIG. 9 illustrates a cross-sectional view 900 of some embodiments corresponding to act 2204.

At act 2206, a bottom electrode layer is formed over the lower insulating structure and the lower interconnect. FIGS. 10-12 illustrate cross-sectional views 1000-1200 of some embodiments corresponding to act 2206.

At act 2208, a seed layer is formed on the bottom electrode layer. FIG. 13 illustrates a cross-sectional view 1300 of some embodiments corresponding to act 2208.

At act 2210, a ferroelectric switching layer is formed on the seed layer. FIG. 14 illustrates a cross-sectional view 1400 of some embodiments corresponding to act 2210. The crystal phase of the ferroelectric switching layer is configured to grow and/or change based on the crystal phase of the seed layer.

At act 2212, an anneal process is performed. The anneal process may change a crystal phase of the ferroelectric switching layer. In various embodiments, the anneal process may be performed after act 2210 and either before or after act 2214. FIG. 14 illustrates a cross-sectional view 1400 of some embodiments corresponding to act 2212.

At act 2214, a top electrode layer is formed over the ferroelectric switching layer. FIG. 15 illustrates a cross-sectional view 1500 of some embodiments corresponding to act 2214.

At act 2216, a first patterning process is performed on the first top electrode layer to form a top electrode. FIG. 16 illustrates a cross-sectional view 1600 of some embodiments corresponding to act 2216.

At act 2218, one or more sidewall spacers are formed along opposing sides of the top electrode. FIG. 17 illustrates a cross-sectional view 1700 of some embodiments corresponding to act 2218.

At act 2220, a second patterning process is performed on the ferroelectric switching layer, the seed layer, and the bottom electrode layer. The second patterning process forms a data storage structure and a bottom electrode. FIG. 18 illustrates a cross-sectional view 1800 of some embodiments corresponding to act 2220.

At act 2222, an upper insulating structure is formed over the top electrode. FIG. 19 illustrates a cross-sectional view 1900 of some embodiments corresponding to act 2222.

At act 2224, an upper ILD layer is formed over the upper insulating structure. FIG. 20 illustrates a cross-sectional view 2000 of some embodiments corresponding to act 2224.

At act 2226, the top electrode via is formed to extend through the upper ILD layer to the top electrode. FIG. 21 illustrates a cross-sectional view 2100 of some embodiments corresponding to act 2226.

FIGS. 23-30 illustrate cross-sectional views of some alternative embodiments of a method of forming an integrated chip having an FeRAM device comprising a data storage structure that includes a seed layer. Although FIGS. 23-30 are described in relation to a method, it will be appreciated that the structures disclosed in FIGS. 23-30 are not limited to such a method, but instead may stand alone as structures independent of the method.

Figure 23:
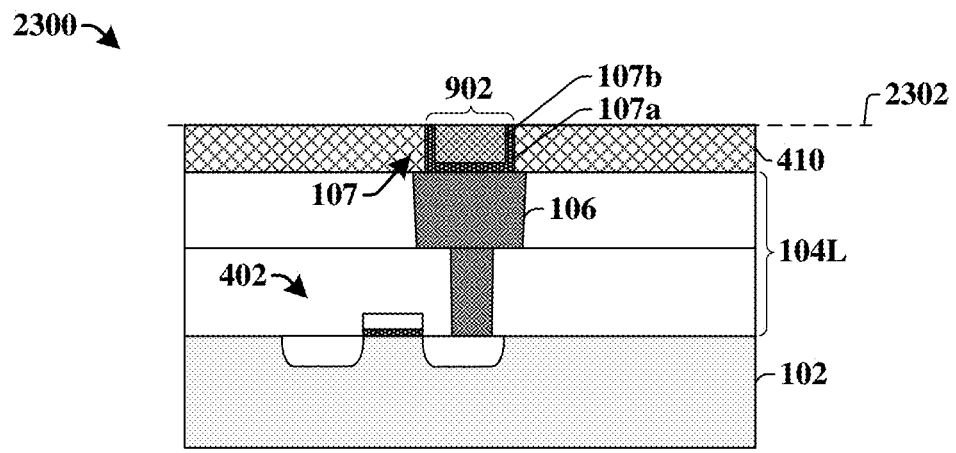
FIGS. 23-30 illustrate cross-sectional views of some additional embodiments of a method of forming an integrated chip having an FeRAM device comprising a data storage structure that includes a seed layer.

As shown in cross-sectional view 2300 of FIG. 23, a substrate 102 is provided. In some embodiments, an access device 402 is formed on and/or within the substrate 102. In some embodiments, a lower interconnect 106 may be formed within one or more lower ILD layers 104L formed over the substrate 102.

A lower insulating structure 410 having an opening 902 is formed over the one or more lower ILD layers 104L. A diffusion barrier layer 107a is formed within the opening 902 and a bottom electrode via layer 107b is formed over the diffusion barrier layer 107a and within the opening 902. A planarization process (e.g., a chemical mechanical planarization (CMP) process) may be performed (along line 2302) to remove excess material of the diffusion barrier layer 107a and the bottom electrode via layer 107b from over a top of the lower insulating structure 410 and to form a bottom electrode via 107.

Figure 24:
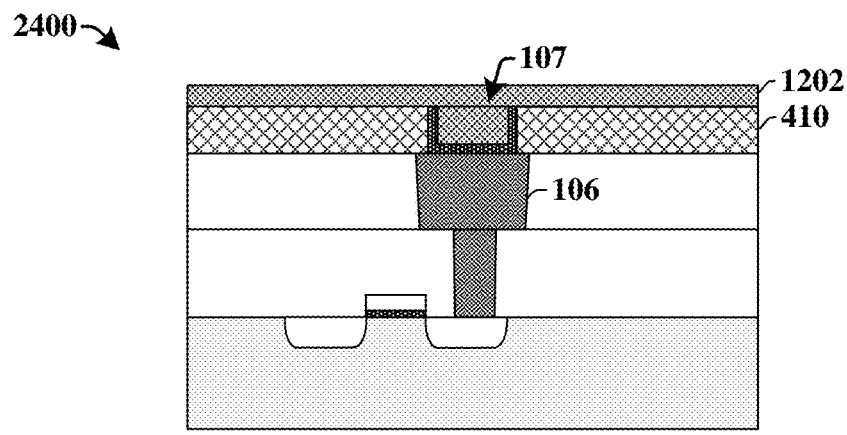

As shown in cross-sectional view 2400 of FIG. 24, a bottom electrode layer 1202 is formed on the bottom electrode via 107. In some embodiments, the bottom electrode layer 1202 may be formed in a manner that is the same or similar to the formation of the bottom electrode layer 1202 described in relation to cross-sectional view 1200 of FIG. 12.

Figure 25:
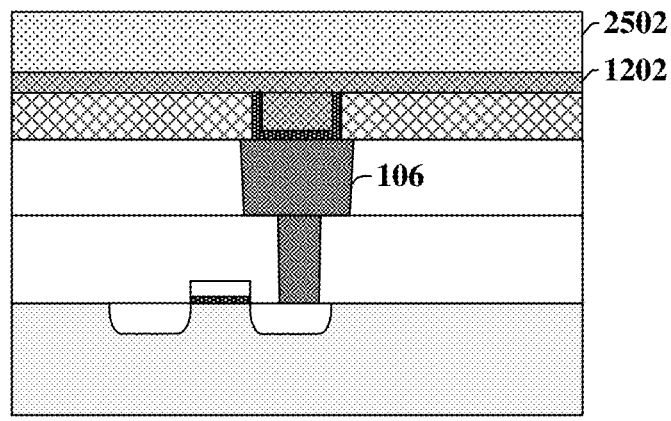

As shown in cross-sectional view 2500 of FIG. 25, a ferroelectric switching layer 2502 is formed on the bottom electrode layer 1202. In some embodiments, the ferroelectric switching layer 2502 may be formed by way of a deposition process (e.g., PVD, CVD, PE-CVD, ALD, sputtering, etc.).

Figure 26:
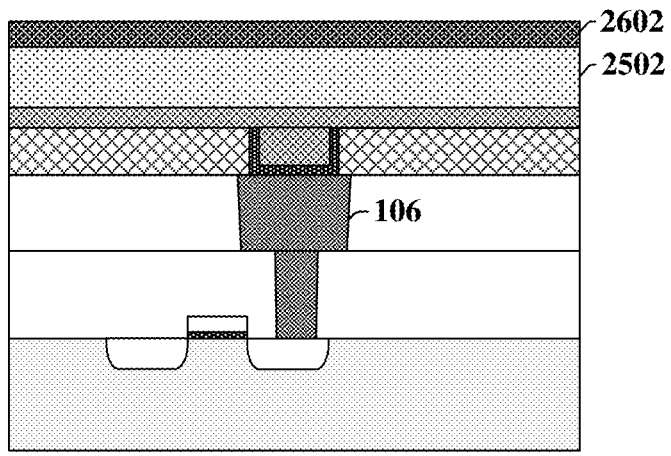

As shown in cross-sectional view 2600 of FIG. 26, a seed layer 2602 is formed on the ferroelectric switching layer 2502. In some embodiments, the seed layer 2602 may be formed by way of a deposition process (e.g., PVD, CVD, PE-CVD, ALD, sputtering, etc.). In some embodiments, the seed layer 2602 may be formed at a temperature of less than or equal to approximately 300° C., less than or equal to approximately 400° C., or other similar values. In some additional embodiments, an anneal process may be performed after deposition of the seed layer 2602. The anneal process changes a crystal phase of the seed layer 2602 and/or the ferroelectric switching layer 2502 to a non-monoclinic crystal phase. In some embodiments, the anneal process may be performed at a temperature of greater than or equal to approximately 300° C., greater than or equal to approximately 400° C., greater than or equal to approximately 500° C., between approximately 300° C. and approximately 500° C., or other similar values.

Figure 27:
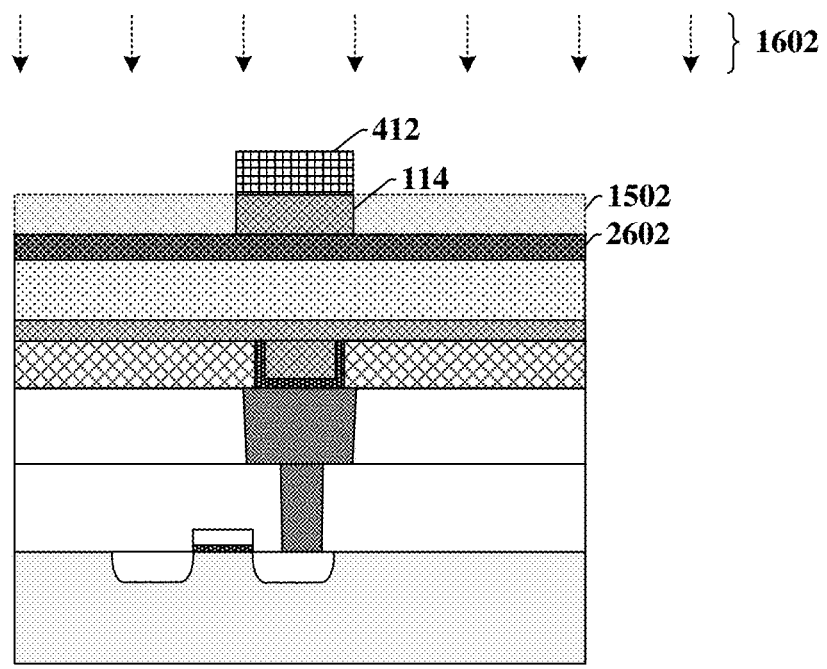

As shown in cross-sectional view 2700 of FIG. 27, a top electrode layer 1502 is formed on the seed layer 2602. A first patterning process is performed on the top electrode layer 1502 to form a top electrode 114. In some embodiments, the first patterning process selectively exposes the top electrode layer 1502 to a first etchant 1602 according to a hard mask 412. In some embodiments, the anneal process may be performed after depositing the top electrode layer 1502.

Figure 28:
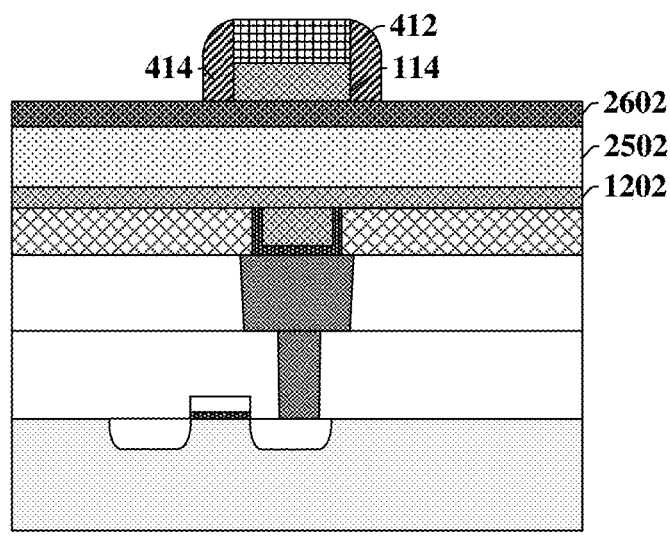

As shown in cross-sectional view 2800 of FIG. 28, one or more sidewall spacers 414 are formed along sidewalls of the top electrode 114 and the hard mask 412. In some embodiments, the one or more sidewall spacers 414 may be formed in a manner that is the same or similar to the formation of the one or more sidewall spacers 414 described in relation to cross-sectional view 1700 of FIG. 17.

Figure 29:
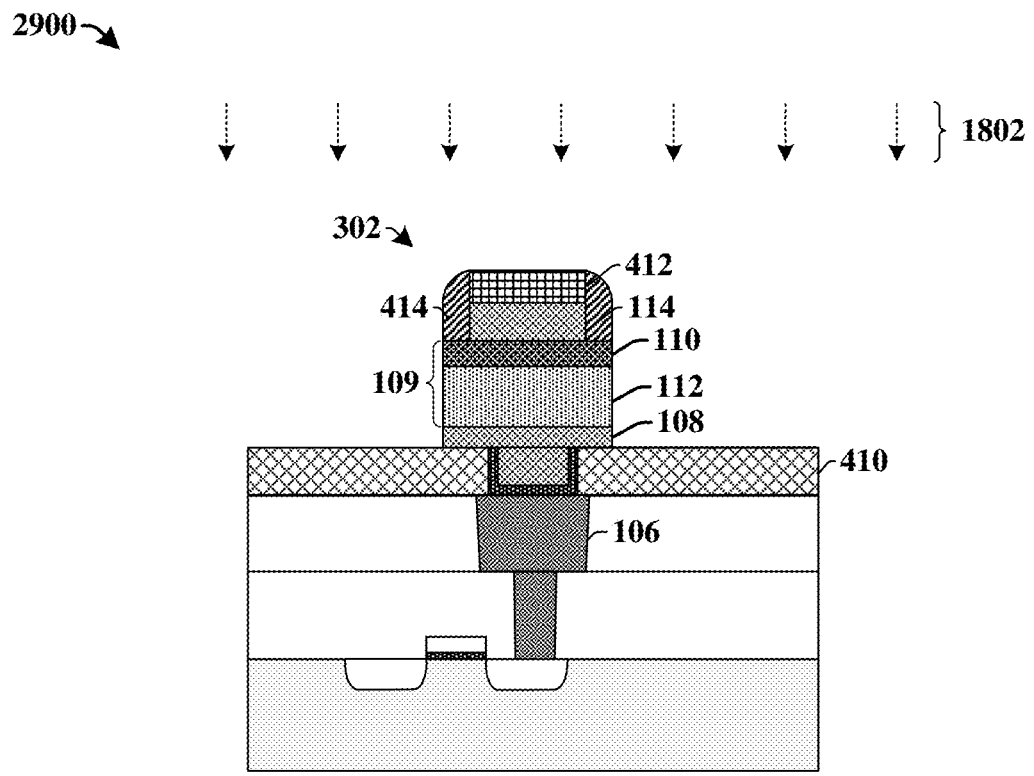

As shown in cross-sectional view 2900 of FIG. 29, a second patterning process is performed on the seed layer (2602 of FIG. 28), the ferroelectric switching layer (2502 of FIG. 28), and the bottom electrode layer (1202 of FIG. 28). The second patterning process forms an FeRAM device 302 having a data storage structure 109 comprising a seed layer 110 and a ferroelectric switching layer 112 disposed between a bottom electrode 108 and the top electrode 114. In some embodiments, the second patterning process selectively exposes the seed layer (2602 of FIG. 28), the ferroelectric switching layer (2502 of FIG. 28), and the bottom electrode layer (1202 of FIG. 28) to a second etchant 1802 in areas that are not covered by the hard mask 412 and the one or more sidewall spacers 414.

Figure 30:
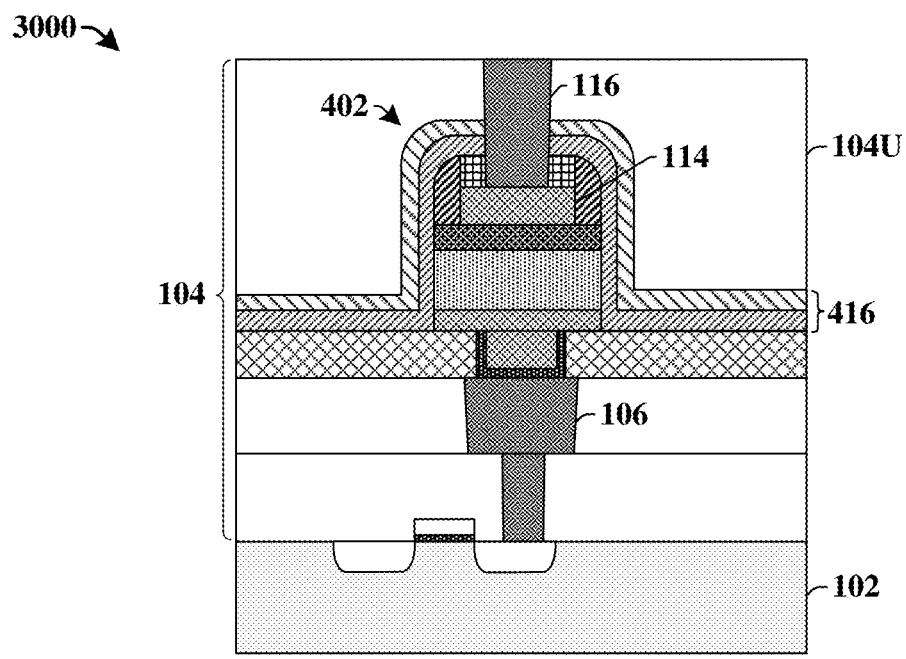

As shown in cross-sectional view 3000 of FIG. 30, an upper insulating structure 416 is formed over the FeRAM device 302. An upper ILD layer 104U is formed over the upper insulating structure 416 to form a dielectric structure 104 over the substrate 102. A top electrode via 116 is formed on the top electrode 114. The top electrode via 116 extends through the upper ILD layer 104U and the upper insulating structure 416 to the top electrode 114.

Figure 31:
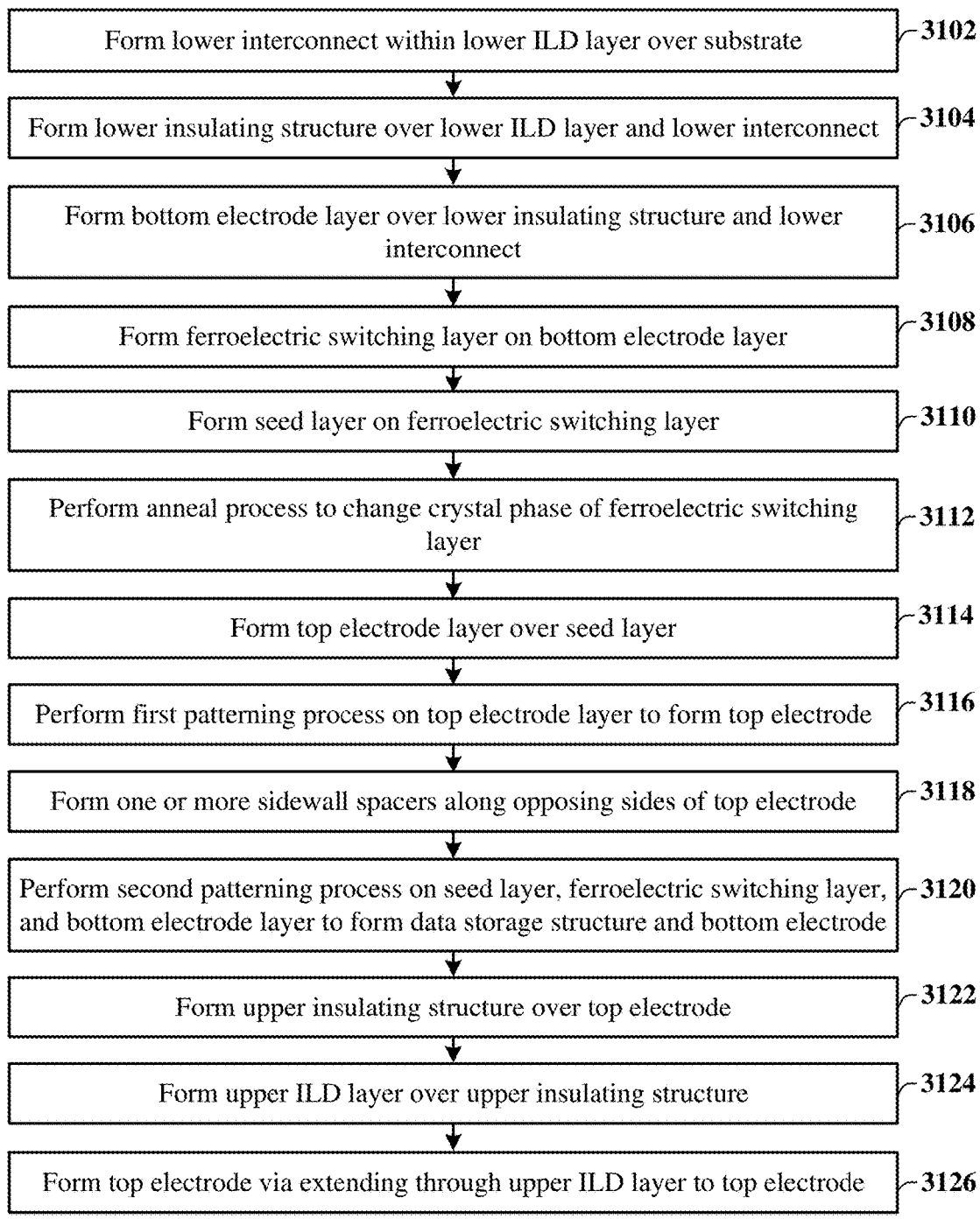
FIG. 31 illustrates a flow diagram of some additional embodiments of a method of forming an integrated chip having an FeRAM device comprising a data storage structure that includes a seed layer.

FIG. 31 illustrates a flow diagram of some embodiments of a method 3100 of forming an integrated chip having an FeRAM device comprising a data storage structure that includes a seed layer.

At act 3102, a lower interconnect is formed within a lower inter-level dielectric (ILD) layer over a substrate. FIG. 23 illustrates a cross-sectional view 2300 of some embodiments corresponding to act 3102.

At act 3104, a lower insulating structure is formed over the lower ILD layer and the lower interconnect. FIG. 23 illustrates a cross-sectional view 2300 of some embodiments corresponding to act 3104.

At act 3106, a bottom electrode layer is formed over the lower insulating structure and the lower interconnect. FIGS. 23-24 illustrate cross-sectional views 2300-2400 of some embodiments corresponding to act 3106.

At act 3108, a ferroelectric switching layer is formed on the bottom electrode layer. FIG. 25 illustrates a cross-sectional view 2500 of some embodiments corresponding to act 3108.

At act 3110, a seed layer is formed on the ferroelectric switching layer. FIG. 26 illustrates a cross-sectional view 2600 of some embodiments corresponding to act 3110.

At act 3112, an anneal process may be performed. The anneal process modifies a crystal phase of the ferroelectric switching layer. In various embodiments, the anneal process may be performed after act 3110 and either before or after act 3114. FIG. 26 illustrates a cross-sectional view 2600 of some embodiments corresponding to act 3112.

At act 3114, a top electrode layer is formed over the seed layer. FIG. 27 illustrates a cross-sectional view 2700 of some embodiments corresponding to act 3114.

At act 3116, a first patterning process is performed on the top electrode layer to form a top electrode. FIG. 27 illustrates a cross-sectional view 2700 of some embodiments corresponding to act 3116.

At act 3118, one or more sidewall spacers are formed along opposing sides of the top electrode. FIG. 28 illustrates a cross-sectional view 2800 of some embodiments corresponding to act 3118.

At act 3120, a second patterning process is performed on the ferroelectric switching layer, the seed layer, and the bottom electrode layer. The second patterning process forms a data storage structure and a bottom electrode. FIG. 29 illustrates a cross-sectional view 2900 of some embodiments corresponding to act 3120.

At act 3122, an upper insulating structure is formed over the top electrode. FIG. 30 illustrates a cross-sectional view 3000 of some embodiments corresponding to act 3122.

At act 3124, an upper ILD layer is formed over the upper insulating structure. FIG. 30 illustrates a cross-sectional view 3000 of some embodiments corresponding to act 3124.

At act 3126, the top electrode via is formed to extend through the upper ILD layer to the top electrode. FIG. 30 illustrates a cross-sectional view 3000 of some embodiments corresponding to act 3126.

FIGS. 32-39 illustrate cross-sectional views of some alternative embodiments of a method of forming an integrated chip having an FeRAM device comprising a data storage structure that includes a seed layer. Although FIGS. 32-39 are described in relation to a method, it will be appreciated that the structures disclosed in FIGS. 32-39 are not limited to such a method, but instead may stand alone as structures independent of the method.

Figure 32:
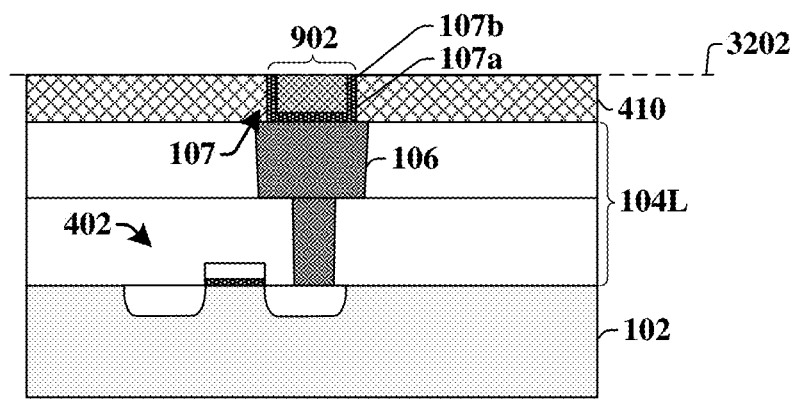
FIGS. 32-39 illustrate cross-sectional views of some additional embodiments of a method of forming an integrated chip having an FeRAM device comprising a data storage structure that includes a seed layer.

As shown in cross-sectional view 3200 of FIG. 32, a substrate 102 is provided. In some embodiments, an access device 402 is formed on and/or within the substrate 102. In some embodiments, a lower interconnect 106 may be formed within one or more lower ILD layers 104L formed over the substrate 102.

A lower insulating structure 410 having an opening 902 is formed over the lower interconnect 106. A diffusion barrier layer 107a is formed within the opening 902 and a bottom electrode via layer 107b is formed over the diffusion barrier layer 107a and within the opening 902. A planarization process (e.g., a chemical mechanical planarization (CMP) process) may be performed (along line 3202) to remove excess material of the diffusion barrier layer 107a and the bottom electrode via layer 107b from over a top of the lower insulating structure 410 to form a bottom electrode via 107.

Figure 33:
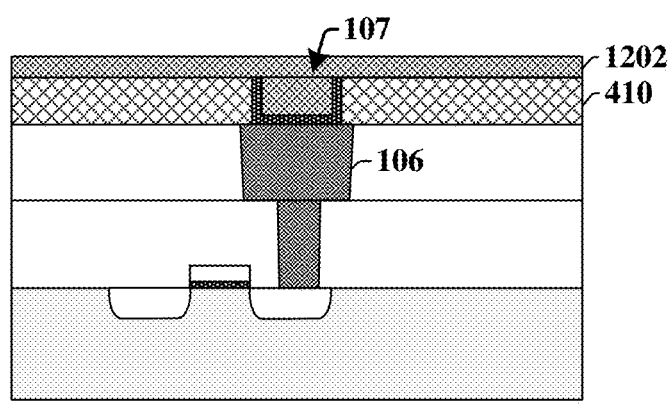

As shown in cross-sectional view 3300 of FIG. 33, a bottom electrode layer 1202 is formed over the bottom electrode via 107. In some embodiments, the bottom electrode layer 1202 may be formed in a manner that is the same or similar to the formation of the bottom electrode layer 1202 described in relation to cross-sectional view 1200 of FIG. 12.

Figure 34:
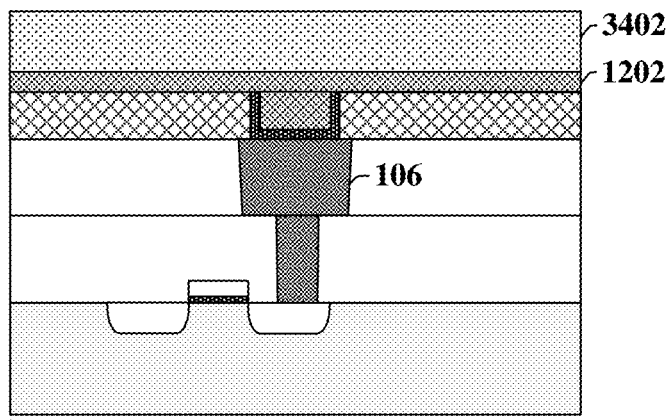

As shown in cross-sectional view 3400 of FIG. 34, a first ferroelectric switching layer 3402 is formed onto the bottom electrode layer 1202. In some embodiments, the first ferroelectric switching layer 3402 may be formed by way of a deposition process (e.g., PVD, CVD, PE-CVD, ALD, sputtering, etc.).

Figure 35:
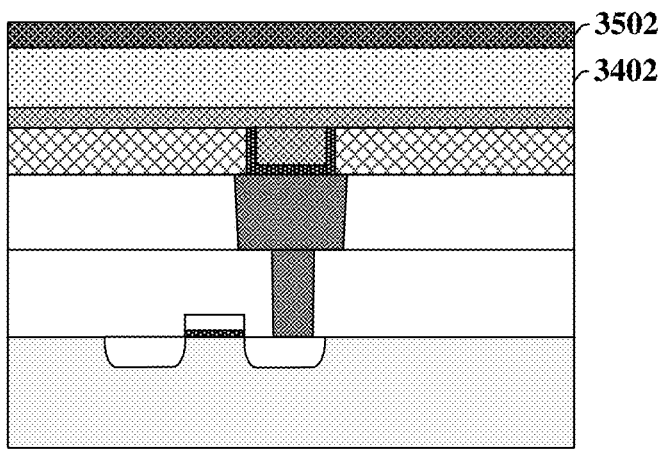

As shown in cross-sectional view 3500 of FIG. 35, a seed layer 3502 is formed over the first ferroelectric switching layer 3402. In some embodiments, the seed layer 3502 may be formed by way of a deposition process (e.g., PVD, CVD, PE-CVD, ALD, sputtering, etc.). In some embodiments, the seed layer 3502 may be formed at a temperature of less than or equal to approximately 300° C., less than or equal to approximately 400° C., between approximately 300° C. and approximately 500° C., or other similar values.

Figure 36:
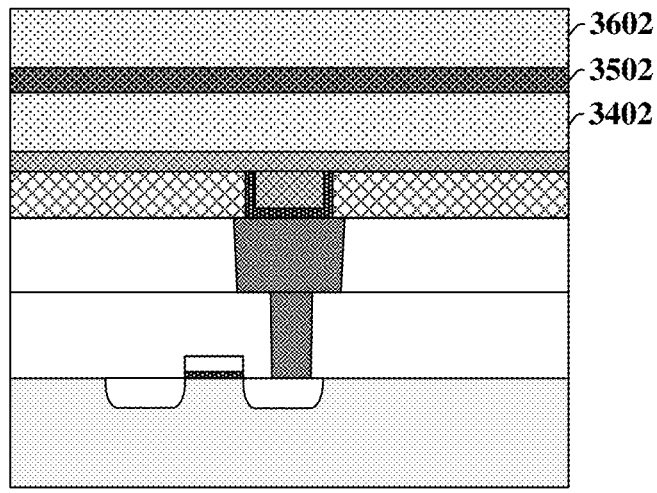

As shown in cross-sectional view 3600 of FIG. 36, a second ferroelectric switching layer 3602 is formed onto the seed layer 3502. In some embodiments, the second ferroelectric switching layer 3602 may be formed by way of a deposition process (e.g., PVD, CVD, PE-CVD, ALD, sputtering, etc.). In some additional embodiments, an anneal process may be performed after deposition of the second ferroelectric switching layer 3602. The anneal process changes a crystal phase of the second ferroelectric switching layer 3602 to a non-monoclinic crystal phase. In some embodiments, the anneal process may further change a crystal phase of the first ferroelectric switching layer 3402 and/or the seed layer 3502 to a non-monoclinic crystal phase. In some embodiments, the anneal process may be performed at a temperature of greater than or equal to approximately 300° C., greater than or equal to approximately 400° C., greater than or equal to approximately 500° C., between approximately 300° C. and approximately 500° C., or other similar values.

Figure 37:
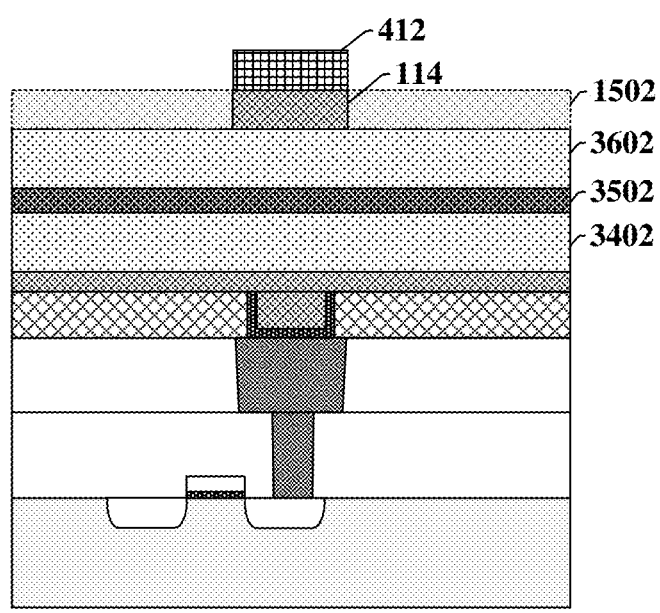

As shown in cross-sectional view 3700 of FIG. 37, a top electrode layer 1502 is formed on second ferroelectric switching layer 3602. In some embodiments, the anneal process may be performed after depositing the top electrode layer 1502. In some embodiments, the top electrode layer 1502 may be formed in a manner that is the same or similar to the formation of the top electrode layer 1502 described in relation to cross-sectional view 1500 of FIG. 15.

After forming the top electrode layer 1502, a first patterning process is performed on the top electrode layer 1502 to form a top electrode 114. In some embodiments, the first patterning process selectively exposes the top electrode layer 1502 to a first etchant 1602 according to a hard mask 412.

Figure 38:
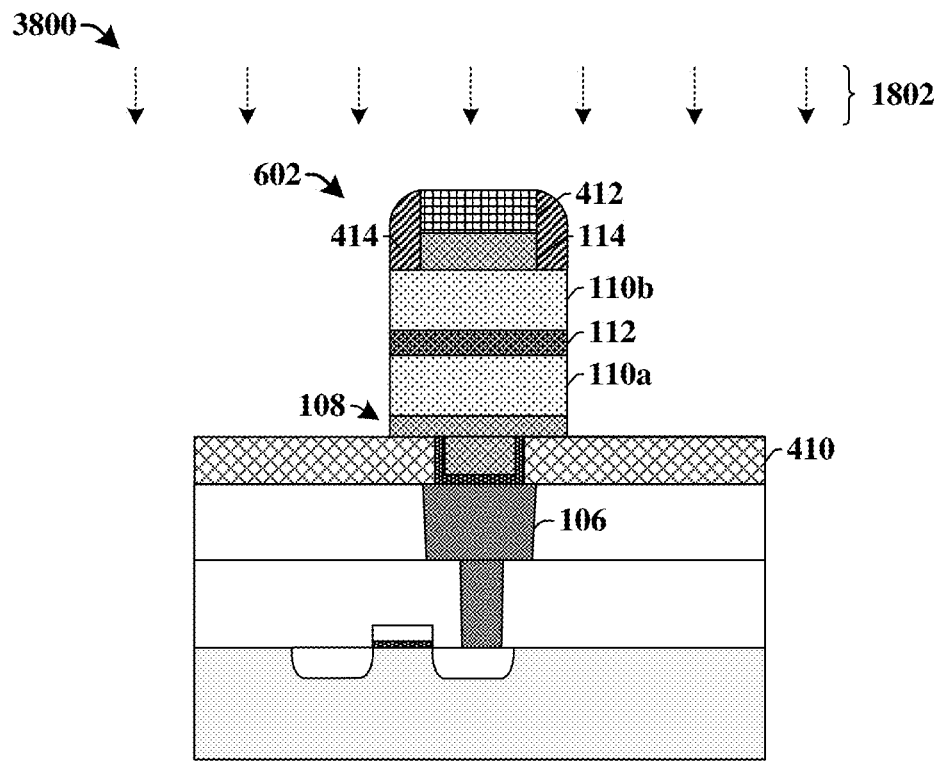

As shown in cross-sectional view 3800 of FIG. 38, one or more sidewall spacers 414 are formed along sidewalls of the top electrode 114 and the hard mask 412. In some embodiments, the one or more sidewall spacers 414 may be formed in a manner that is the same or similar to the formation of the one or more sidewall spacers 414 described in relation to cross-sectional view 1700 of FIG. 17.

A second patterning process is subsequently performed on the second ferroelectric switching layer (3602 of FIG. 37), the seed layer (3502 of FIG. 37), the first ferroelectric switching layer (3502), and the bottom electrode layer (1202 of FIG. 37) to form an FeRAM device 602. In some embodiments, the second patterning process selectively exposes the second ferroelectric switching layer (3602 of FIG. 37), the seed layer (3502 of FIG. 37), the first ferroelectric switching layer (3502), and the bottom electrode layer (1202 of FIG. 37) to a second etchant 1802 in areas that are not covered by the hard mask 412 and the one or more sidewall spacers 414.

Figure 39:
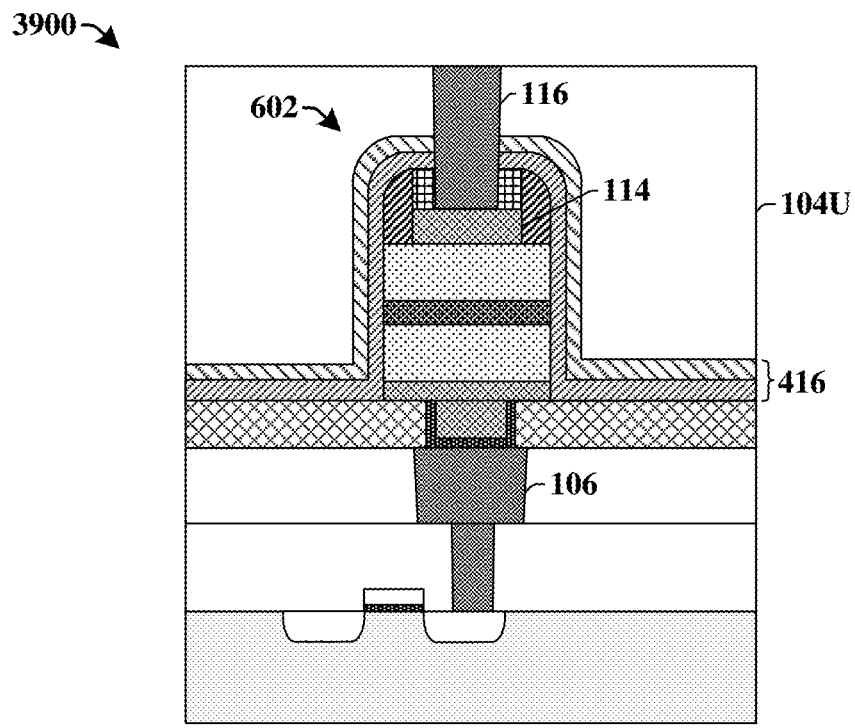

As shown in cross-sectional view 3900 of FIG. 39, an upper insulating structure 416 is formed over the FeRAM device 602. An upper ILD layer 104U is formed over the upper insulating structure 416 to form a dielectric structure 104 over the substrate 102. A top electrode via 116 is formed on the top electrode 114. The top electrode via 116 extends through the upper ILD layer 104U and the upper insulating structure 416.

Figure 40:
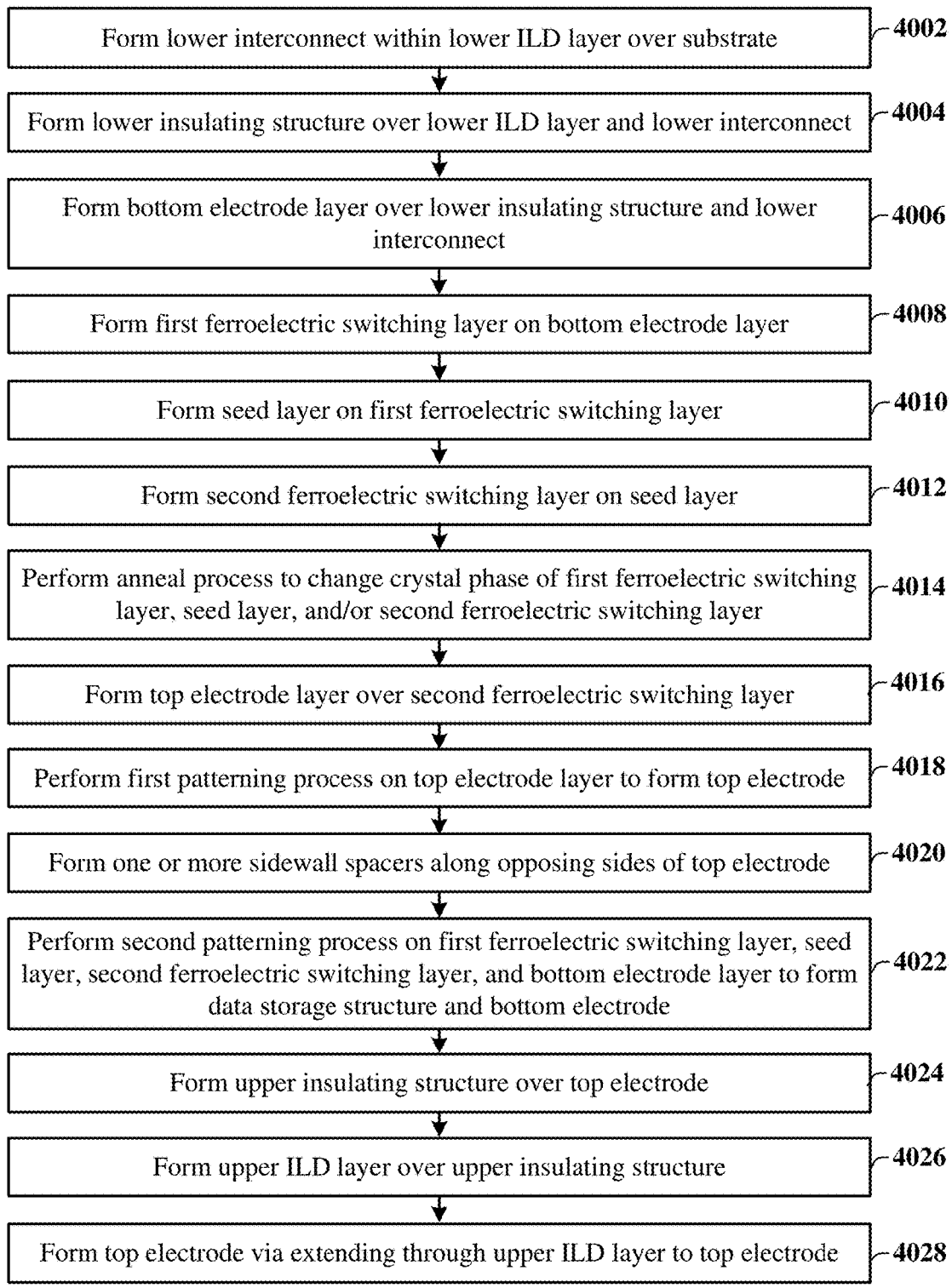
FIG. 40 illustrates a flow diagram of some additional embodiments of a method of forming an integrated chip having an FeRAM device comprising a data storage structure that includes a seed layer.

FIG. 40 illustrates a flow diagram of some embodiments of a method 4000 of forming an integrated chip having an FeRAM device comprising a data storage structure that includes a seed layer.

At act 4002, a lower interconnect is formed within a lower inter-level dielectric (ILD) layer over a substrate. FIG. 32 illustrates a cross-sectional view 3200 of some embodiments corresponding to act 4002.

At act 4004, a lower insulating structure is formed over the lower ILD layer and the lower interconnect. FIG. 32 illustrates a cross-sectional view 3200 of some embodiments corresponding to act 4004.

At act 4006, a bottom electrode layer is formed over the lower insulating structure and the lower interconnect. FIGS. 32-33 illustrate cross-sectional views 3200-3300 of some embodiments corresponding to act 4006.

At act 4008, a first ferroelectric switching layer is formed on the bottom electrode layer. FIG. 34 illustrates a cross-sectional view 3400 of some embodiments corresponding to act 4008.

At act 4010, a seed layer is formed on the first ferroelectric switching layer. FIG. 35 illustrates a cross-sectional view 3500 of some embodiments corresponding to act 4010.

At act 4012, a second ferroelectric switching layer is formed on the seed layer. FIG. 36 illustrates a cross-sectional view 3600 of some embodiments corresponding to act 4012.

At act 4014, an anneal process is performed. The anneal process changes a crystal phase of the first ferroelectric switching layer, the seed layer, and/or the second ferroelectric switching layer. In various embodiments, the anneal process may be performed after act 4012 and either before or after act 4016. FIG. 36 illustrates a cross-sectional view 3600 of some embodiments corresponding to act 4014.

At act 4016, a top electrode layer is formed over the second ferroelectric switching layer. FIG. 37 illustrates a cross-sectional view 3700 of some embodiments corresponding to act 4016.

At act 4018, a first patterning process is performed on the top electrode layer to form a top electrode. FIG. 37 illustrates a cross-sectional view 3700 of some embodiments corresponding to act 4018.

At act 4020, one or more sidewall spacers are formed along opposing sides of the top electrode. FIG. 38 illustrates a cross-sectional view 3800 of some embodiments corresponding to act 4020.

At act 4022, a second patterning process is performed on the first ferroelectric switching layer, the seed layer, the second ferroelectric layer, and the bottom electrode layer. The second patterning process forms a data storage structure and a bottom electrode. FIG. 38 illustrates a cross-sectional view 3800 of some embodiments corresponding to act 4022.

At act 4024, an upper insulating structure is formed over the top electrode. FIG. 39 illustrates a cross-sectional view 3900 of some embodiments corresponding to act 4024.

At act 4026, an upper ILD layer is formed over the upper insulating structure. FIG. 39 illustrates a cross-sectional view 3900 of some embodiments corresponding to act 4026.

At act 4028, the top electrode via is formed to extend through the upper ILD layer and to the top electrode. FIG. 39 illustrates a cross-sectional view 3900 of some embodiments corresponding to act 4028.

FIGS. 41-48 illustrate cross-sectional views of some alternative embodiments of a method of forming an integrated chip having an FeRAM device comprising a data storage structure that includes a double seed layer. Although FIGS. 41-48 are described in relation to a method, it will be appreciated that the structures disclosed in FIGS. 41-48 are not limited to such a method, but instead may stand alone as structures independent of the method.

Figure 41:
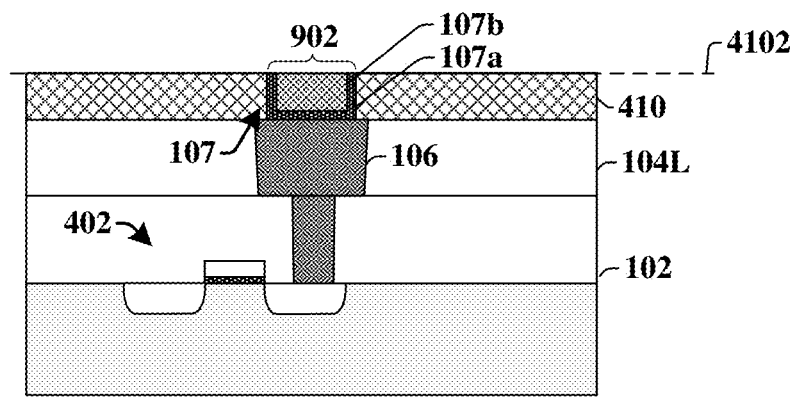
FIGS. 41-48 illustrate cross-sectional views of some additional embodiments of a method of forming an integrated chip having an FeRAM device comprising a data storage structure that includes a seed layer.

As shown in cross-sectional view 4100 of FIG. 41, a substrate 102 is provided. In some embodiments, an access device 402 is formed on and/or within the substrate 102. In some embodiments, a lower interconnect 106 may be formed within one or more lower ILD layers 104L formed over the substrate 102.

A lower insulating structure 410 having an opening 902 is formed over the lower interconnect 106. A diffusion barrier layer 107a is formed within the opening 902 and a bottom electrode via layer 107b is formed over the diffusion barrier layer 107a and within the opening 902. A planarization process (e.g., a chemical mechanical planarization (CMP) process) may be performed (along line 4102) to remove excess material of the diffusion barrier layer 107a and the bottom electrode via layer 107b from over a top of the lower insulating structure 410 to form a bottom electrode via 107.

Figure 42:
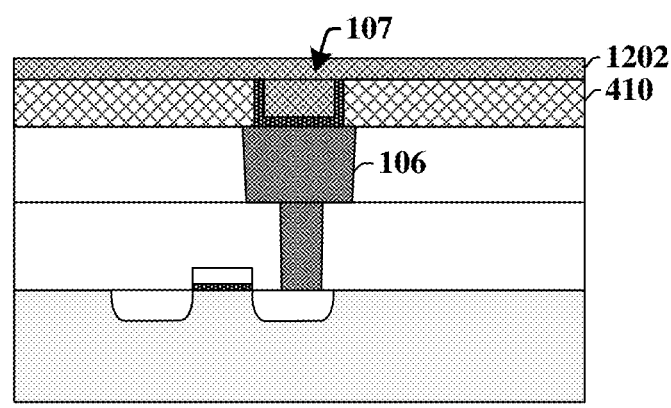

As shown in cross-sectional view 4200 of FIG. 42, a bottom electrode layer 1202 is formed over the bottom electrode via 107. In some embodiments, the bottom electrode layer 1202 may be formed in a manner that is the same or similar to the formation of the bottom electrode layer 1202 described in relation to cross-sectional view 1200 of FIG. 12.

Figure 43:
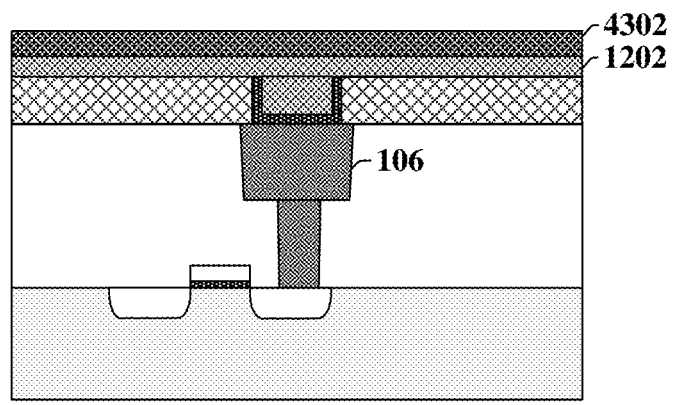

As shown in cross-sectional view 4300 of FIG. 43, a first seed layer 4302 is formed onto the bottom electrode layer 1202. In some embodiments, the first seed layer 4302 may be formed by way of a deposition process (e.g., PVD, CVD, PE-CVD, ALD, sputtering, etc.). In some embodiments, the first seed layer 4302 may be formed at a temperature of less than or equal to approximately 300° C., less than or equal to approximately 400° C. or other similar values.

Figure 44:
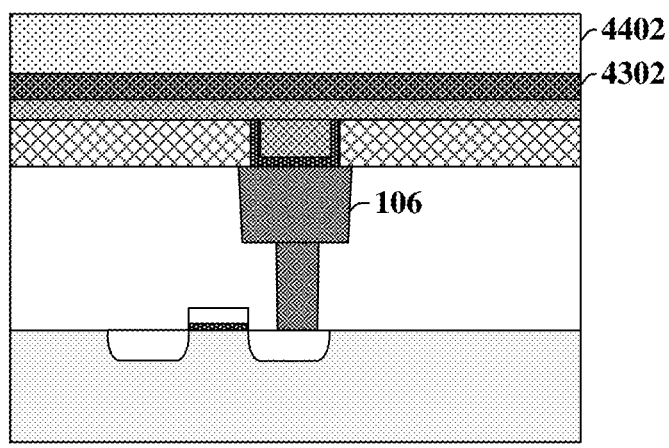

As shown in cross-sectional view 4400 of FIG. 44, a ferroelectric switching layer 4402 is formed over the first seed layer 4302. In some embodiments, the ferroelectric switching layer 4402 may be formed by way of a deposition process (e.g., PVD, CVD, PE-CVD, ALD, sputtering, etc.).

Figure 45:
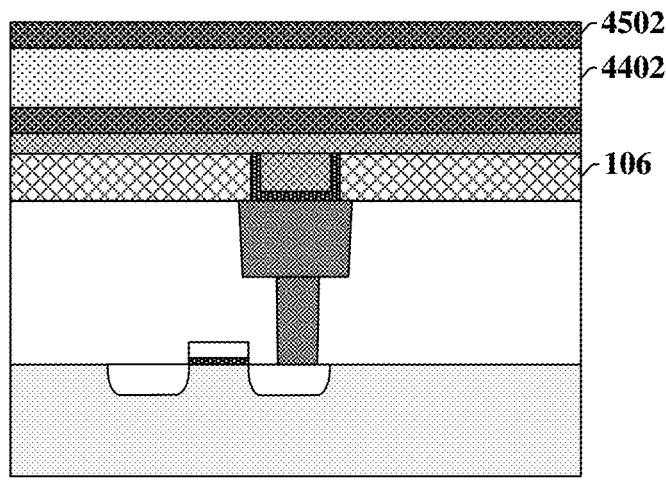

As shown in cross-sectional view 4500 of FIG. 45, a second seed layer 4502 is formed onto the ferroelectric switching layer 4402. In some embodiments, the second seed layer 4502 may be formed by way of a deposition process (e.g., PVD, CVD, PE-CVD, ALD, sputtering, etc.). In some embodiments, the second seed layer 4502 may be formed at a temperature of approximately 300° C., less than or equal to approximately 400° C. or other similar values. In some embodiments, an anneal process may be performed after formation of the second seed layer 4502 to change a crystal phase of the ferroelectric switching layer 4402, the first seed layer 4302, and/or the second seed layer 4502. In various embodiments, the anneal process may be performed at a temperature of approximately 300° C., less than or equal to approximately 400° C., between approximately 300° C. and approximately 500° C., or other similar values.

Figure 46:
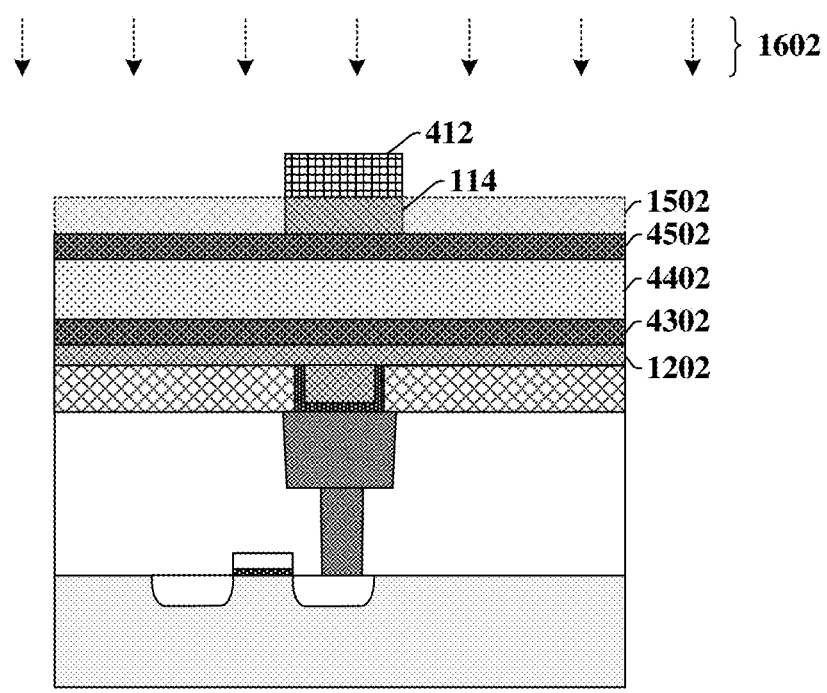

As shown in cross-sectional view 4600 of FIG. 46, a top electrode layer 1502 is formed on the second seed layer 4502. In some embodiments, the anneal process may be performed after depositing the top electrode layer 1502. In some embodiments, the top electrode layer 1502 may be formed in a manner that is the same or similar to the formation of the top electrode layer 1502 described in relation to cross-sectional view 1500 of FIG. 15.

After forming the top electrode layer 1502, a first patterning process is performed on the top electrode layer 1502 to form a top electrode 114. In some embodiments, the first patterning process selectively exposes the top electrode layer 1502 to a first etchant 1602 according to a hard mask 412.

Figure 47:
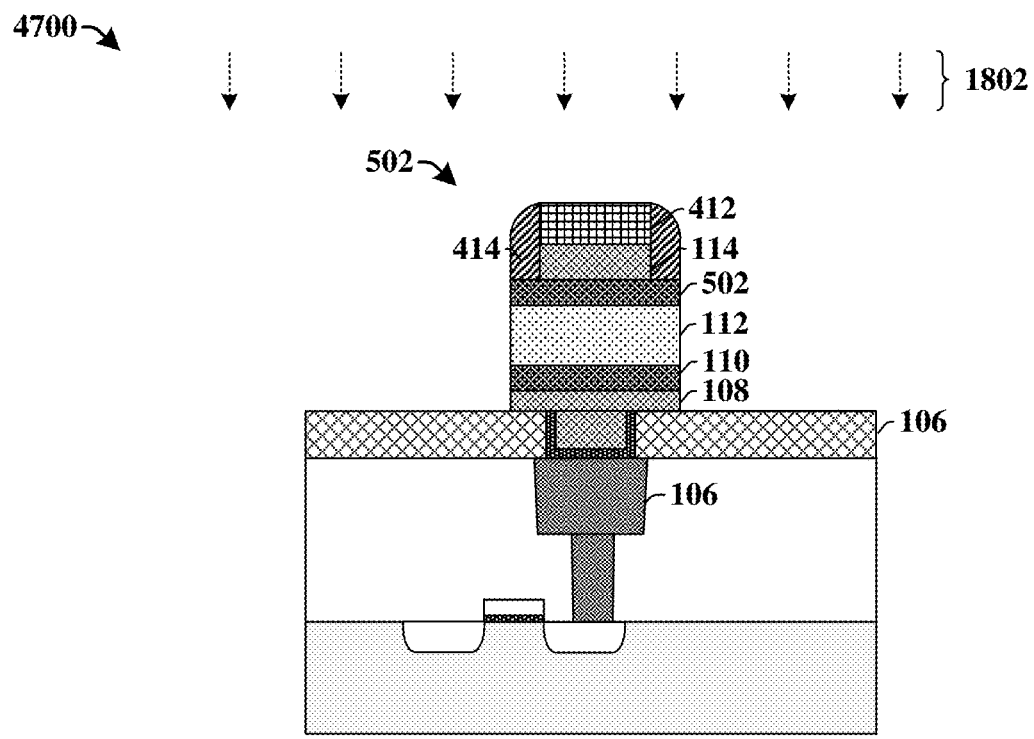

As shown in cross-sectional view 4700 of FIG. 47, one or more sidewall spacers 414 may be formed along sidewalls of the top electrode 114 and the hard mask 412. In some embodiments, the one or more sidewall spacers 414 may be formed in a manner that is the same or similar to the formation of the one or more sidewall spacers 414 described in relation to cross-sectional view 1700 of FIG. 17.

A second patterning process is subsequently performed on the second seed layer (4502 of FIG. 46), the ferroelectric switching layer (4402 of FIG. 46), the first seed layer (4302 of FIG. 46), and the bottom electrode layer (1202 of FIG. 46) to form an FeRAM device 502. In some embodiments, the second patterning process selectively exposes the second seed layer (4502 of FIG. 46), the ferroelectric switching layer (4402 of FIG. 46), the first seed layer (4302 of FIG. 46), and the bottom electrode layer (1202 of FIG. 46) to a second etchant 1802 in areas that are not covered by the hard mask 412 and the one or more sidewall spacers 414.

Figure 48:
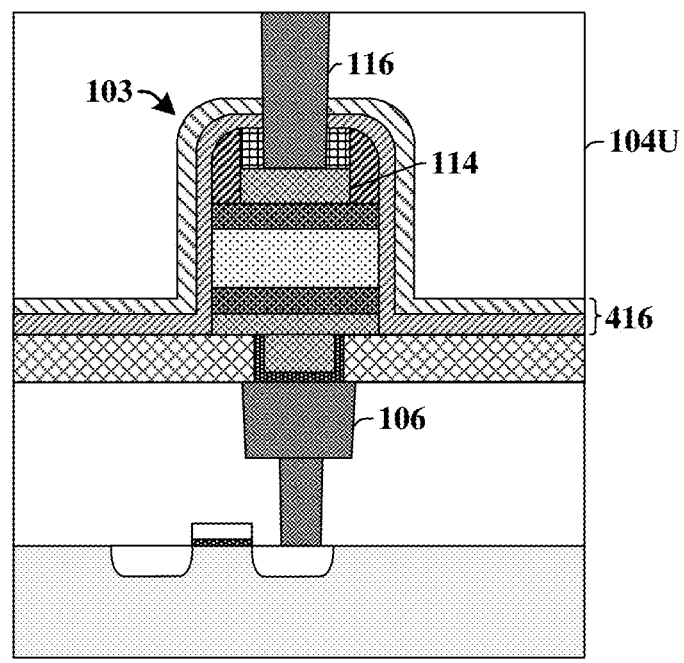

As shown in cross-sectional view 4800 of FIG. 48, an upper insulating structure 416 is formed over the FeRAM device 502. An upper ILD layer 104U is formed over the upper insulating structure 416 to form a dielectric structure 104 over the substrate 102. A top electrode via 116 is formed on the top electrode 114. The top electrode via 116 extends through the upper ILD layer 104U and the upper insulating structure 416 to the top electrode 114.

Figure 49:
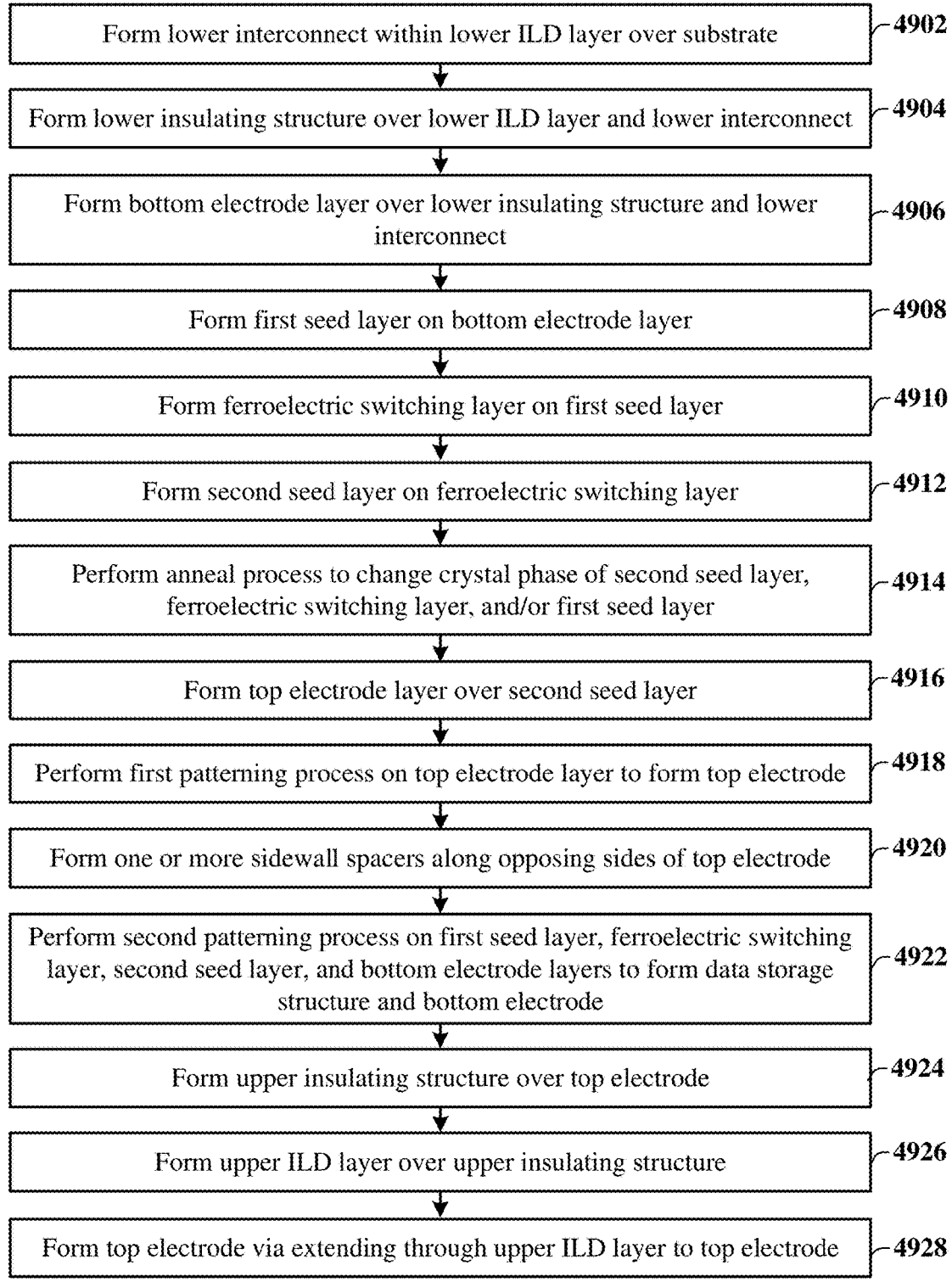
FIG. 49 illustrates a flow diagram of some additional embodiments of a method of forming an integrated chip having an FeRAM device comprising a data storage structure that includes a seed layer.

FIG. 49 illustrates a flow diagram of some embodiments of a method 4900 of forming an integrated chip having an FeRAM device comprising a data storage structure that includes a seed layer.

At act 4902, a lower interconnect is formed within a lower inter-level dielectric (ILD) layer over a substrate. FIG. 41 illustrates a cross-sectional view 4100 of some embodiments corresponding to act 4902.

At act 4904, a lower insulating structure is formed over the lower ILD layer and the lower interconnect. FIG. 41 illustrates a cross-sectional view 4100 of some embodiments corresponding to act 4904.

At act 4906, a bottom electrode layer is formed over the lower insulating structure and the lower interconnect. FIGS. 41-42 illustrate cross-sectional views 4100-4200 of some embodiments corresponding to act 4906.

At act 4908, a first seed layer is formed on the bottom electrode layer. FIG. 43 illustrates a cross-sectional view 4300 of some embodiments corresponding to act 4908.

At act 4910, a ferroelectric switching layer is formed on the first seed layer. FIG. 44 illustrates a cross-sectional view 4400 of some embodiments corresponding to act 4910.

At act 4912, a second seed layer is formed on the ferroelectric switching layer. FIG. 45 illustrates a cross-sectional view 4500 of some embodiments corresponding to act 4912.

At act 4914, an anneal process is performed. The anneal process changes a crystal phase of the ferroelectric switching layer, the first seed layer, and/or the second seed layer. In various embodiments, the anneal process may be performed after act 4912 and either before or after act 4916. FIG. 45 illustrates a cross-sectional view 4500 of some embodiments corresponding to act 4914.

At act 4916, a top electrode layer is formed over the second seed layer. FIG. 46 illustrates a cross-sectional view 4600 of some embodiments corresponding to act 4916.

At act 4918, a first patterning process is performed on the top electrode layer to form a top electrode. FIG. 46 illustrates a cross-sectional view 4600 of some embodiments corresponding to act 4918.

At act 4920, one or more sidewall spacers are formed along opposing sides of the top electrode. FIG. 47 illustrates a cross-sectional view 4700 of some embodiments corresponding to act 4920.

At act 4922, a second patterning process is performed on the first seed layer, the ferroelectric switching layer, the second seed layer, and the one or more bottom electrode layers. The second patterning process forms a data storage structure and a bottom electrode. FIG. 47 illustrates a cross-sectional view 4700 of some embodiments corresponding to act 4922.

At act 4924, an upper insulating structure is formed over the top electrode. FIG. 48 illustrates a cross-sectional view 4800 of some embodiments corresponding to act 4924.

At act 4926, an upper ILD layer is formed over the upper insulating structure. FIG. 48 illustrates a cross-sectional view 4800 of some embodiments corresponding to act 4926.

At act 4928, the top electrode via is formed to extend through the upper ILD layer to the top electrode. FIG. 48 illustrates a cross-sectional view 4800 of some embodiments corresponding to act 4928.

Accordingly, in some embodiments, the present disclosure, relates to an integrated chip having an FeRAM device comprising a data storage structure having a seed layer with a crystal phase (e.g., an orthorhombic crystal phase) that is configured to improve a ferroelectricity of a ferroelectric switching layer.

In some embodiments, the present disclosure relates to an integrated chip. The integrated chip includes a bottom electrode disposed over a substrate; a top electrode disposed over the bottom electrode; a ferroelectric switching layer arranged between the bottom electrode and the top electrode, the ferroelectric switching layer configured to change polarization based upon one or more voltages applied to the bottom electrode or the top electrode; and a seed layer arranged between the bottom electrode and the top electrode, the seed layer and the ferroelectric switching layer having a non-monoclinic crystal phase. In some embodiments, the ferroelectric switching layer includes a first region having a monoclinic crystal phase and a second region having the non-monoclinic crystal phase. In some embodiments, the non-monoclinic crystal phase includes a cubic crystal phase, a tetragonal crystal phase, or an orthorhombic crystal phase. In some embodiments, the seed layer includes a zirconium oxide, a hafnium oxide, a silicon oxide, a tantalum oxide, an aluminum oxide, a titanium oxide, an yttrium oxide, a gadolinium oxide, a lanthanum oxide, or a strontium oxide. In some embodiments, the seed layer is disposed between the ferroelectric switching layer and the bottom electrode. In some embodiments, the seed layer is disposed between the ferroelectric switching layer and the top electrode. In some embodiments, the integrated chip further includes a second ferroelectric switching layer between the bottom electrode and the top electrode, the ferroelectric switching layer separates the seed layer from the bottom electrode and the second ferroelectric switching layer separates the seed layer from the top electrode. In some embodiments, the integrated chip further includes a second seed layer disposed between the ferroelectric switching layer and the top electrode, the seed layer separates the ferroelectric switching layer from the bottom electrode and the second seed layer separates the ferroelectric switching layer from the top electrode. In some embodiments, the seed layer and the second seed layer are different materials. In some embodiments, the ferroelectric switching layer directly contacts the seed layer.

In other embodiments, the present disclosure relates to an integrated chip. The integrated chip includes a bottom electrode disposed over a substrate; a top electrode disposed over the bottom electrode; a seed layer arranged between the bottom electrode and the top electrode, the seed layer having a non-monoclinic crystal phase; and a ferroelectric switching layer arranged between the bottom electrode and the top electrode, the ferroelectric switching layer includes a first region having a monoclinic crystal phase and a second region having the non-monoclinic crystal phase. In some embodiments, the non-monoclinic crystal phase is a cubic crystal phase, a tetragonal crystal phase, or an orthorhombic crystal phase. In some embodiments, the second region contacts the seed layer and separates the seed layer from the first region. In some embodiments, the seed layer is arranged between the ferroelectric switching layer and the bottom electrode. In some embodiments, the integrated chip further includes a second seed layer arranged between the ferroelectric switching layer and the top electrode, the ferroelectric switching layer further having a third region that is separated from the second region by the first region and that has a second non-monoclinic crystal phase. In some embodiments, the seed layer has a crystallized temperature of less than approximately 500° C.

In yet other embodiments, the present disclosure relates to a method of forming an integrated chip. The method includes forming a bottom electrode layer over a substrate; forming a seed layer over the bottom electrode layer; forming a ferroelectric switching layer over the bottom electrode layer and contacting the seed layer, the ferroelectric switching layer formed to have a first region with a first crystal phase and a second region with a different crystal phase; forming a top electrode layer over the ferroelectric switching layer; and performing one or more patterning processes on the bottom electrode layer, the seed layer, the ferroelectric switching layer, and the top electrode layer to form an FeRAM device. In some embodiments, the method further includes performing an anneal process after forming both the seed layer and the ferroelectric switching layer, wherein the anneal process modifies a crystal phase of at least a part of the ferroelectric switching layer. In some embodiments, the anneal process is performed at a temperature of between approximately 300° C. and approximately 500° C. In some embodiments, the method further includes forming the ferroelectric switching layer to contact an upper surface of the seed layer; and forming a second seed layer to contact an upper surface of the ferroelectric switching layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
a bottom electrode disposed over a substrate;
a top electrode disposed over the bottom electrode;
a ferroelectric switching layer arranged between the bottom electrode and the top electrode, wherein the ferroelectric switching layer is configured to change polarization based upon one or more voltages applied to the bottom electrode or the top electrode;
a seed layer arranged between the bottom electrode and the top electrode, wherein the seed layer and the ferroelectric switching layer comprise a non-monoclinic crystal phase; and
wherein the ferroelectric switching layer comprises a first region having a monoclinic crystal phase and a second region having the non-monoclinic crystal phase, wherein the first region is along a sidewall of the ferroelectric switching layer.

2. The integrated chip of claim 1, wherein the non-monoclinic crystal phase comprises a cubic crystal phase.

3. The integrated chip of claim 1, further comprising:
a second seed layer arranged between the top electrode and the second region of the ferroelectric switching layer, wherein the second seed layer and the second region of the ferroelectric switching layer comprise the non-monoclinic crystal phase;
wherein the first region of the ferroelectric switching layer is over the seed layer;
wherein the seed layer is between the bottom electrode and the first region;
wherein the first region and the second region are separated by a third region with the monoclinic crystal phase; and
wherein the first region, the second region, and the third region are a first material.

4. The integrated chip of claim 3, wherein the seed layer and the second seed layer are different materials.

5. The integrated chip of claim 1, wherein the ferroelectric switching layer directly contacts the seed layer.

6. An integrated chip, comprising:
a bottom electrode disposed over a substrate;
a top electrode disposed over the bottom electrode;
a seed layer arranged between the bottom electrode and the top electrode, wherein the seed layer comprises a non-monoclinic crystal phase; and
a ferroelectric switching layer arranged between the bottom electrode and the top electrode, wherein the ferroelectric switching layer comprises a first region having a monoclinic crystal phase and a second region having the non-monoclinic crystal phase,
wherein the ferroelectric switching layer comprises a single layer of material that continuously extends between a bottom surface along a bottom of the second region and a top surface along a top of the first region, and wherein the second region is separated from the top electrode by the first region.

7. The integrated chip of claim 6, wherein the non-monoclinic crystal phase is a cubic crystal phase, a tetragonal crystal phase, or an orthorhombic crystal phase.

8. The integrated chip of claim 6, wherein the first region and the second region consist of a first material that extends between the top surface and the bottom surface of the ferroelectric switching layer.

9. The integrated chip of claim 6, further comprising a second seed layer arranged between the ferroelectric switching layer and the top electrode, wherein the seed layer is arranged between the ferroelectric switching layer and the bottom electrode, and wherein the ferroelectric switching layer comprises a third region having a second non-monoclinic crystal phase that is separated from the second region by the first region.

10. The integrated chip of claim 6, wherein the seed layer has a crystallized temperature of less than approximately 500° C.

11. An integrated chip, comprising:
a bottom electrode disposed over a substrate;
a top electrode disposed over the bottom electrode;
a seed layer arranged between the bottom electrode and the top electrode, wherein the seed layer has a first crystal phase;
a ferroelectric switching layer arranged between the bottom electrode and the top electrode, wherein the ferroelectric switching layer is a single material and comprises:
a first region contacting the seed layer and having the first crystal phase; and
a second region separated from the seed layer by the first region and having a second crystal phase that is different than the first crystal phase,
wherein the second region extends from one sidewall of the ferroelectric switching layer to an opposite sidewall of the ferroelectric switching layer.

12. The integrated chip of claim 11, wherein the seed layer has a non-monoclinic crystal phase, the first region has the non-monoclinic crystal phase, and the second region has a monoclinic crystal phase.

13. The integrated chip of claim 11, further comprising:
a second seed layer between the bottom electrode and the top electrode, wherein the ferroelectric switching layer separates the seed layer from the second seed layer; and
a third region of the ferroelectric switching layer that is separated from the first region by the second region, wherein the third region is a same material as the first region and the second region, and wherein the third region and the second seed layer have a third crystal phase with a miller index of (110) or (111).

14. The integrated chip of claim 13, wherein the seed layer and the second seed layer physically contact opposing surfaces of the ferroelectric switching layer, and wherein the first region and the second region consist of the same material.

15. The integrated chip of claim 3, wherein the seed layer and the second seed layer consist of zirconium oxide, and the ferroelectric switching layer consists of hafnium oxide.

16. The integrated chip of claim 3, wherein the seed layer, the second seed layer, and the ferroelectric switching layer consist of hafnium oxide.

17. The integrated chip of claim 3, wherein the first region is in contact with the seed layer and the second region is in contact with the second seed layer.

18. The integrated chip of claim 1, wherein the integrated chip has a 0.3 volt read window.

19. The integrated chip of claim 3, wherein the third region of the ferroelectric switching layer extends from one sidewall of the ferroelectric switching layer to an opposite sidewall of the ferroelectric switching layer, has a first boundary shared with the first region and a second boundary shared with the second region, and the first and second boundary are each separated by a distance that varies across the ferroelectric switching layer.

20. The integrated chip of claim 9, wherein the first region and the third region of the ferroelectric switching layer have a combined thickness that is approximately 90% of a thickness of the ferroelectric switching layer.

* * * * *